US012717246B2

(12) United States Patent
Blanton et al.

(10) Patent No.: US 12,717,246 B2
(45) Date of Patent: Aug. 25, 2026

(54) ONE-DIMENSIONAL OVERLAY MARKS

(71) Applicant: Intel Corporation, Santa Clara, CA (US)

(72) Inventors: William Blanton, Cornelius, OR (US); Deepak Selvanathan, Portland, OR (US); Shakul Tandon, Portland, OR (US); Martin N. Weiss, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 193 days.

(21) Appl. No.: 17/854,799

(22) Filed: Jun. 30, 2022

(65) Prior Publication Data

US 2024/0004310 A1 Jan. 4, 2024

(51) Int. Cl.
*G03F 7/00* (2006.01)
*H10W 46/00* (2026.01)

(52) U.S. Cl.
CPC ........ *G03F 7/70633* (2013.01); *H10W 46/00* (2026.01)

(58) Field of Classification Search
CPC ................... G03F 7/70633; H01L 2223/54426
See application file for complete search history.

(56) References Cited

U.S. PATENT DOCUMENTS

| | | | | |
|---|---|---|---|---|
| 7,181,057 | B2 * | 2/2007 | Adel | G06V 40/171 382/145 |
| 7,876,438 | B2 * | 1/2011 | Ghinovker | G06F 30/39 702/155 |
| 9,653,404 | B1 * | 5/2017 | Wang | H01L 23/544 |
| 10,747,123 | B2 * | 8/2020 | Kim | H01L 23/544 |
| 10,795,268 | B2 * | 10/2020 | Chen | G03F 9/7076 |
| 12,259,662 | B2 * | 3/2025 | Jeong | G03F 7/70216 |
| 12,292,694 | B2 * | 5/2025 | Chien | H01L 23/544 |
| 2002/0182518 | A1 * | 12/2002 | Van Haren | H01L 22/34 430/4 |
| 2011/0229830 | A1 * | 9/2011 | Bhattacharyya | G03F 7/70625 356/625 |

(Continued)

OTHER PUBLICATIONS

Adel, Mike et al., "Optimized Overlay Metrology Marks: Theory and Experiment," IEEE Transactions on Semiconductor Manufacturing, vol. 17, No. 2 (May 2004) (14 pages).

(Continued)

*Primary Examiner* — Evren Seven
(74) *Attorney, Agent, or Firm* — Alliance IP, LLC

(57) ABSTRACT

Embodiments disclosed herein include semiconductor die with overlay marks, electronic devices that include semiconductor dies with overlay marks, and methods of measuring overlay. In one embodiment, a semiconductor die includes multiple overlay marks, including a first overlay mark and a second overlay mark. The first overlay mark is at a first position on the semiconductor die and includes a first set of patterns with a first orientation. The second overlay mark is at a second position on the semiconductor die and includes a second set of patterns with a second orientation. The first position of the first mark and the second position of the second mark are non-overlapping. In addition, the first orientation of the patterns in the first mark is substantially orthogonal to the second orientation of the patterns in the second mark.

23 Claims, 14 Drawing Sheets

(56) References Cited

U.S. PATENT DOCUMENTS

2016/0033398 A1* 2/2016 Kim ...................... H01L 23/544
356/243.1
2016/0247766 A1* 8/2016 Conklin .............. H01L 21/0337
2017/0176871 A1* 6/2017 Van Buel ............. G01N 21/956
2019/0279940 A1* 9/2019 Shibazaki ........... G03F 7/70633
2022/0384358 A1* 12/2022 Lee ........................... G03F 1/42
2023/0213873 A1* 7/2023 Ma .................... G03F 7/706837
430/22
2023/0215809 A1* 7/2023 Ma ............................ G03F 1/42
257/797

OTHER PUBLICATIONS

Dasari, Prasad et al., "Diffraction Based Overlay Metrology for Double Patterning Technologies," Recent Advances in Nanofabrication Techniques and Applications, (Dec. 2, 2011) (24 pages).

Lee, Honggoo et al., "Device Overlay Method for High Volume Manufacturing," Proc of SPIE vol. 9778, 97781F (2016) (6 pages).

Leray, Philippe et al., "Diffraction Based Overlay Metrology: Accuracy and Performance on Front End Stack," Proc of SPIE, vol. 6922 69220O-1, (2008) (12 pages).

Messinis, Christopher et al., "Diffraction-Based Overlay Metrology Using Angular-Multiplexed Acquisition of Dark-Field Digital Holograms," Optics Express, vol. 28, No. 25, (Dec. 7, 2020, published Nov. 24, 2020), (17 pages).

* cited by examiner

220

$Y_{1,1}$ 221

$Y_{1,2}$ 222

$Y_{2,1}$ 223

$Y_{2,2}$ 224

Y

X

320

ONE-DIMENSIONAL OVERLAY MARKS

BACKGROUND

Overlay metrology refers to the process of measuring overlay between different layers or lithography steps during fabrication of an integrated circuit (IC). In order to measure overlay, metrology structures referred to as "overlay marks" are printed onto the substrate and inspected during the photolithography process to determine the overlay error between different layers or lithography steps.

Since interactions between the IC fabrication process and the mark designs can impact measurement robustness and accuracy, it is common to have multiple versions of a given overlay mark with different styles of measurement features for redundancy. Each overlay mark incorporates measurement features for both the x axis and y axis into a single two-dimensional (2D) structure. Further, each 2D mark only provides one style of measurement feature for each direction. As a result, the same 2D mark must be used to measure overlay in both the x and y directions, and the performance of the 2D mark is limited by its least capable set of measurement features, which often results in less accurate overlay measurements.

DETAILED DESCRIPTION

Figure 1:
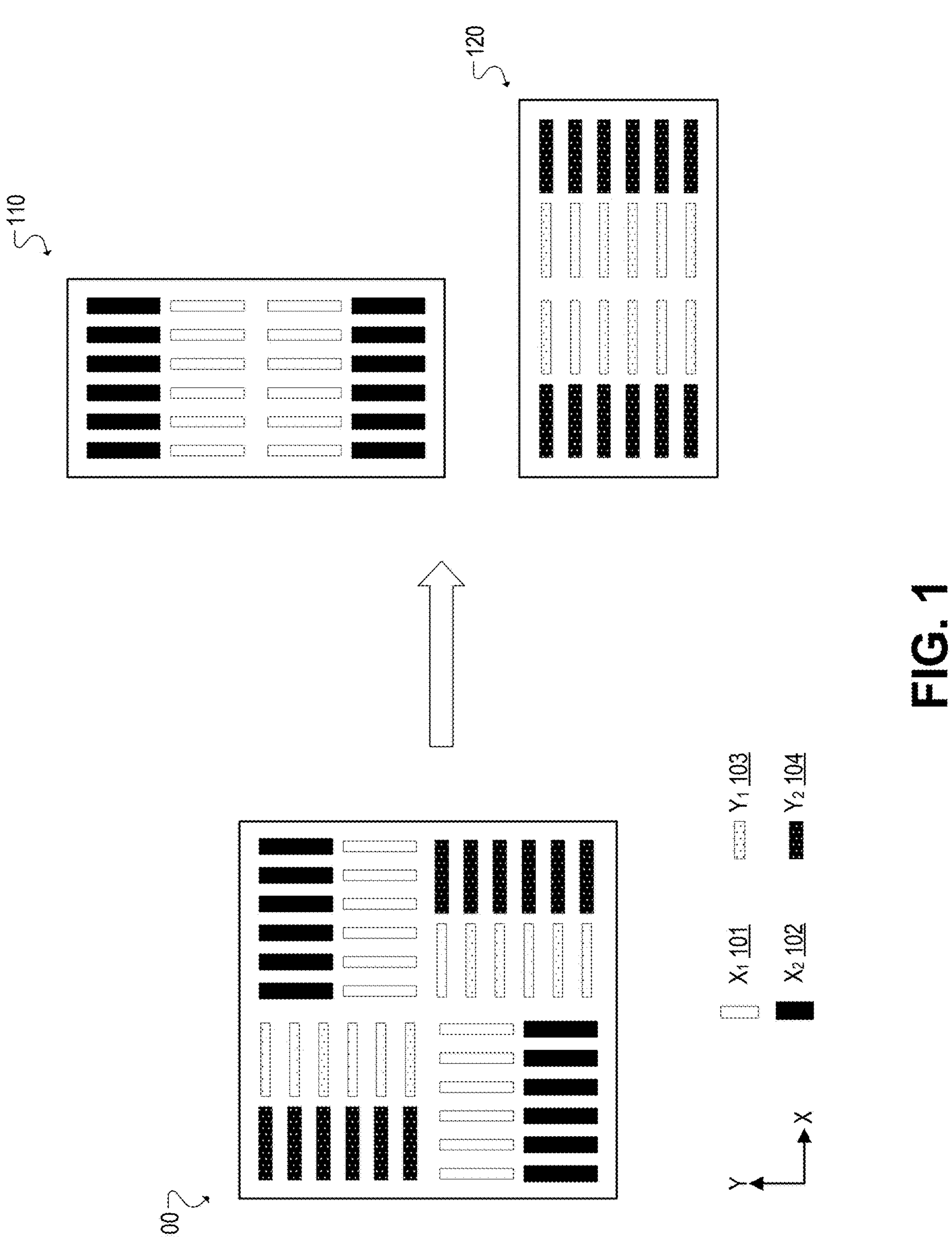
FIG. 1 illustrates an example of decomposing a two-dimensional (2D) advanced imaging metrology (AIM) overlay mark into separate one-dimensional (1D) overlay marks.

Integrated circuits (ICs) are becoming smaller and more powerful. As ICs become smaller, the location and alignment of features on the ICs becomes more critical. Features, such as transistors, vias, and the like, are created on semiconductor substrates using photolithography processes. Photolithography uses optics to define features on the substrate. A feature may be drawn on a reticle, or mask, and light is shown through the mask so as to project the feature onto a layer of photoresist on the substrate. Photoresist is a light sensitive film that either becomes soluble or insoluble when exposed to light. After the layer of photoresist has been exposed to light, the soluble portion can be removed, typically by immersion in a developer solution. Other processing techniques, such as etching or annealing, may be performed to the underlying substrate that has been exposed as a result of the photolithography.

To form complex features in an IC, several layers of processing need to be completed, with each of the layers being aligned within a given margin of error. That is, the amount of misalignment (also referred to as overlay) needs to be within certain tolerances in order to produce functioning devices. The overlay tolerances continue to decrease as ICs scale to smaller feature sizes.

In order to measure overlay, metrology structures (also sometimes referred to as "overlay marks," "overlay targets", or just "marks" or "targets") are printed onto the substrate during the photolithography process, and those metrology structures are inspected to determine the overlay error between different layers or lithography steps.

These overlay marks come in a variety of styles, including box-in-box (BiB), advanced imaging metrology (AIM), and scatterometry overlay (SCOL) marks. Further, overlay can be measured using several metrology techniques, including image-based overlay (IBO), e-beam overlay (eOVL), and diffraction-based overlay (DBO). Image-based overlay (IBO) uses an optical microscope to measure overlay and is typically used with BiB or AIM marks. E-beam overlay (eOVL) is similar to IBO but uses an electron beam to measure overlay (e.g., using a scanning electron microscope (SEM) rather than an optical microscope). Diffraction-based overlay (DBO) typically measures overlay based on the intensity of light scattered on SCOL marks, which contain grating-over-grating targets, or grating patterns from two reticles superimposed or stacked on top of each other in different layers. For example, since an overlay error between these grating patterns changes the light intensities on the patterns, overlay can be measured based on the light intensities.

Regardless of the particular mark style or metrology technique, these overlay marks incorporate measurement features for measuring overlay along both the x and y axis into a single two-dimensional (2D) structure. Interactions between the integrated wafer fabrication process and the mark designs can impact measurement robustness and accuracy, however, which limits overlay capability. To mitigate this, it is common to have multiple versions of a given overlay mark, printed with different styles of measurement features.

Since 2D overlay marks integrate measurement features for the x and y directions into the same target, however, they lack the ability to independently select reticles/layouts from different marks to measure overlay along each axis. Additionally, for a given direction (e.g., either x or y), these 2D marks lack the flexibility to choose different styles of measurement feature for individual reticles or layers, as each mark provides a single set of measurement features for each reticle/layer in each direction. Due to this lack of flexibility, the performance of a 2D mark is limited by its least capable set of measurement features, which ultimately reduces the accuracy of the overlay measurements.

For example, one drawback of the 2D mark layout is that if one set of features should give suboptimal performance (e.g., due to damage from the integrated process), then the performance of the entire mark is compromised. Another drawback of a 2D mark is that algorithms that utilize edge detection of the printed feature are unable to utilize the region around intersections of horizontal or vertical features, even when these intersections occur between the over and under layers. In some cases, this limits the total edge length available for actual data collection.

Accordingly, this disclosure presents various embodiments of one-dimensional (1D) mark designs that provide a high degree of flexibility with respect to selecting measurement features for the x and y directions, which is currently absent in the 2D-style designs. This flexibility enables the user to individually select which structures are measured in the x versus y direction and also provides an additional degree of freedom regarding the specific features that are used to generate the overlay measurement for a given reticle/layer. The ability to individually pick the best measurement features for each reticle and direction translates into improved metrology capability and ultimately better overlay control.

For example, a 2D overlay target can be decomposed into separate 1D overlay targets, which gives the user access to the same information, while also providing the ability to individually select which structures are measured in the x and y directions. Multiple styles of measurement features for a given reticle can be incorporated into the same mark to provide additional options. The approach is applicable to image-based overlay, diffraction-based overlay, and e-beam-based overlay measurements.

These 1D mark designs provide numerous advantages. For example, 1D marks offer the potential for improved overlay metrology capability and hence improved overlay control. The 1D marks provide the ability to select the best layouts for each reticle and direction individually, which avoids having to make the compromises that are inherent in 2D mark designs. Further, these 1D marks can be located on the wafer either in the scribe line (e.g., to enable efficient scribe usage) or in active die regions.

FIG. 1 illustrates an example of decomposing a 2D advanced imaging metrology (AIM) overlay mark 100 into separate 1D marks 110, 120 for overlay measurements in the x and y directions, respectively. In some embodiments, the decomposed 1D marks 110, 120 may be used with image-based overlay techniques and/or e-beam overlay techniques. Further, a similar approach can be used to decompose a 2D scatterometry overlay (SCOL) mark into separate 1D marks for diffraction-based overlay techniques, as described further in connection with FIG. 7.

With 2D marks, there is no flexibility to choose which features are measured for each reticle/layer and direction. Further, even if multiple 2D marks with different measurement feature styles are used for a given application, there is no guarantee that the best measurement features for all reticles/layers and directions will be located in the same mark. To circumvent these limitations, a 2D mark 100 can be decomposed into two physically separate 1D marks 110, 120 for the x and y directions, which allows independent selection of measurement feature pairs in each direction.

In the illustrated example, the 2D mark 100 includes patterns for measuring overlay between two layers in both the x and y directions. For example, the 2D mark 100 includes vertical grating patterns 101, 102 on the first and second layers, referred to as $X_1$ and $X_2$, to measure overlay in the x direction. Similarly, the 2D mark 100 includes horizontal grating patterns 103, 104 on the first and second layers, referred to as $Y_1$ and $Y_2$, to measure overlay in the y direction.

The patterns on each layer may be formed by the same reticle. For example, the $X_1$ and $Y_1$ grating patterns 101, 103 on the first layer may be formed by the same reticle, which may be used to form a first layer of semiconductor features on a substrate. Similarly, the $X_2$ and $Y_2$ grating patterns 102, 104 on the second layer may be formed by the same reticle, which may be used to form a second layer of semiconductor features on the substrate.

Further, the grating patterns 101-104 include periodic series of lines and spaces, and each grating pattern 101-104 may have different characteristics, such as pitch and duty cycle. For example, pitch may refer to the period of the line series (e.g., the width of a single line/space pair) and duty cycle may refer to the line-to-period ratio (e.g., ratio of line width to period).

In the illustrated example, the 2D mark 100 is decomposed into separate 1D marks 110, 120 for the respective x and y directions. For example, the 1D mark 110 for measuring overlay in the x direction includes the $X_1$ pattern 101 on the first layer and the $X_2$ pattern on the second layer 102. Similarly, the 1D mark 120 for measuring overlay in the y direction includes the $Y_1$ pattern 103 on the first layer and the $Y_2$ pattern on the second layer 104. The x overlay is measured by computing the difference in the center of symmetry of the $X_1$ and $X_2$ patterns 101, 102, and the y overlay is measured by computing the difference in the center of symmetry of the $Y_1$ and $Y_2$ patterns 103, 104.

In this manner, the two 1D marks 110, 120 collectively contain the same information as the original 2D mark 100. However, when multiple styles of measurement features (e.g., grating patterns) are provided either in the same or different 1D marks (e.g., as shown in FIGS. 2-5), the 1D marks provide the freedom for the user to select the best set of measurement features in the x direction and the y direction independently. This added flexibility from decoupling the measurement features for the x and y directions into separate 1D marks can significantly improve the overall measurement performance.

Figures 2A, 2B:
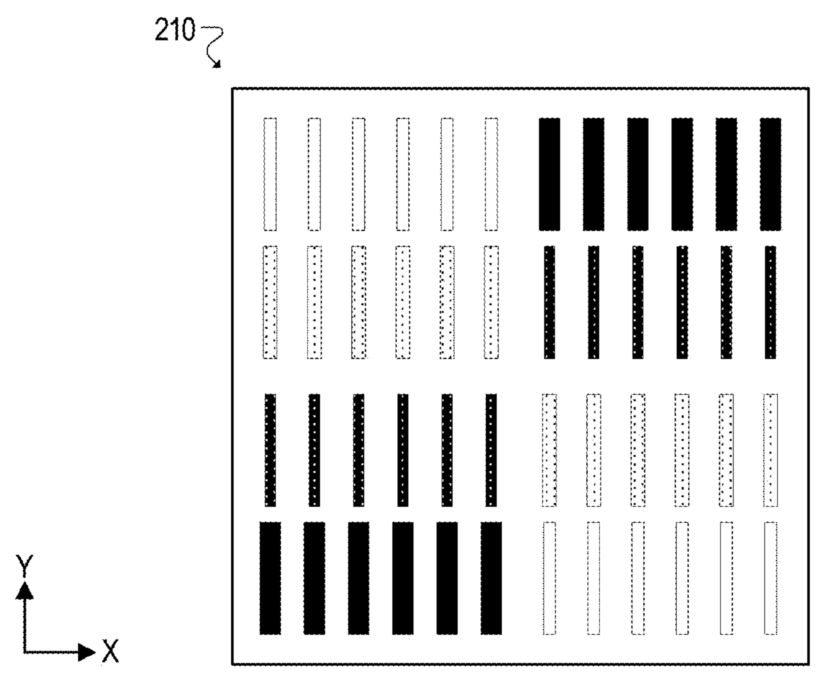
FIGS. 2A-B illustrate examples of separate 1D marks for x and y overlay measurements across two layers with multiple measurement options per layer.

FIGS. 2A-B illustrate examples of separate 1D marks 210, 220 for x and y overlay measurements across two layers with multiple measurement features or patterns to choose from per layer. In particular, FIG. 2A shows a 1D mark 210 for measuring overlay in the x direction, and FIG. 2B shows a 1D mark 220 for measuring overlay in the y direction. In some embodiments, these 1D marks 210, 220 may be used with image-based overlay techniques and/or e-beam overlay techniques.

Throughout this disclosure, the notation $X_{layer,pattern}$ generally refers to a particular pattern on a particular layer/reticle for an x overlay measurement, and the notation $Y_{layer,pattern}$ refers to a particular pattern on a particular layer/reticle for a y overlay measurement.

In FIG. 2A, the 1D mark 210 for the x overlay measurement includes two vertical grating patterns 211, 212 on the first layer, referred to as $X_{1,1}$ and $X_{1,2}$, and two vertical grating patterns 213, 214 on the second layer, referred to as $X_{2,1}$ and $X_{2,2}$. The $X_{1,1}$ and $X_{1,2}$ patterns represent different measurement features on the first layer that can be selected for the x overlay measurement, and the $X_{2,1}$ and $X_{2,2}$ patterns represent different measurement features on the second layer that can be selected for the x overlay measurement. In this manner, the x overlay measurement can be performed using (i) $X_{1,1}$ and $X_{2,1}$; (ii) $X_{1,1}$ and $X_{2,2}$; (iii) $X_{1,2}$ and $X_{2,1}$; or (iv) $X_{1,2}$ and $X_{2,2}$.

In FIG. 2B, the 1D mark 220 for the y overlay measurement includes two horizontal grating patterns 221, 222 on the first layer, referred to as $Y_{1,1}$ and $Y_{1,2}$, and two horizontal grating patterns 223, 224 on the second layer, referred to as $Y_{2,1}$ and $Y_{2,2}$. The $Y_{1,1}$ and $Y_{1,2}$ patterns represent different measurement features on the first layer that can be selected for the y overlay measurement, and the $Y_{2,1}$ and $Y_{2,2}$ patterns represent different measurement features on the second layer that can be selected for the y overlay measurement. In this manner, the y overlay measurement can be performed using (i) $Y_{1,1}$ and $Y_{2,1}$; (ii) $Y_{1,1}$ and $Y_{2,2}$; (iii) $Y_{1,2}$ and $Y_{2,1}$; or (iv) $Y_{1,2}$ and $Y_{2,2}$.

The patterns on each layer may be formed by the same reticle. For example, the $X_{1,1}$, $X_{1,2}$, $Y_{1,1}$, and $Y_{1,2}$ grating patterns 211, 212, 221, 222 may be formed by the same reticle, and the $X_{2,1}$, $X_{2,2}$, $Y_{2,1}$, and $Y_{2,2}$ grating patterns 213, 214, 223, 224 may be formed by the same reticle. Further, the respective grating patterns 211-214, 221-224 may have different characteristics, such as pitch and duty cycle. Moreover, each grating pattern 211-214, 221-224 includes two identical portions arranged with 180 degree symmetry.

In this manner, the 1D marks 210, 220 include multiple styles of measurement features or patterns for each layer/reticle (layer one and two) and direction (x and y), thus providing an additional degree of freedom to select the best feature for each layer and direction individually. For example, the respective patterns 211-214, 221-224 can be mixed and matched as described above to measure overlay in each direction using the optimal features on each layer.

While the 1D marks in this example include two styles of patterns per layer and per direction, this approach can be extended to support additional styles per layer and/or additional layers, as described below in connection with other figures.

Figure 3A:
FIGS. 3A-B illustrate examples of separate 1D marks for x and y overlay measurements across three layers with multiple measurement options per layer.
Figure 3A:
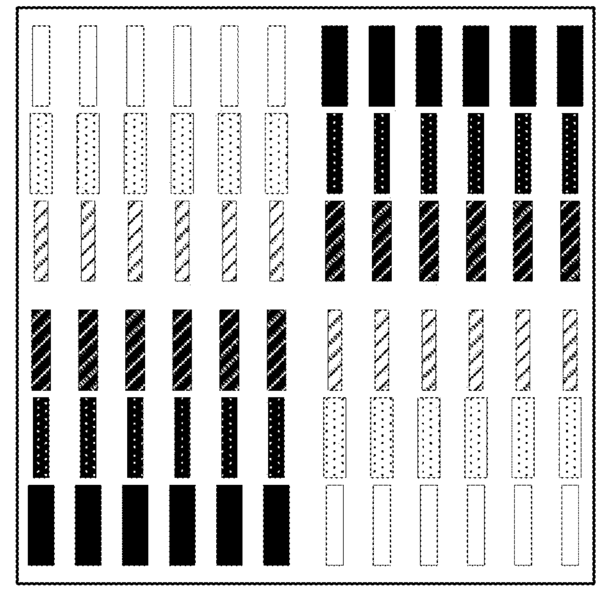
Figure 3B:
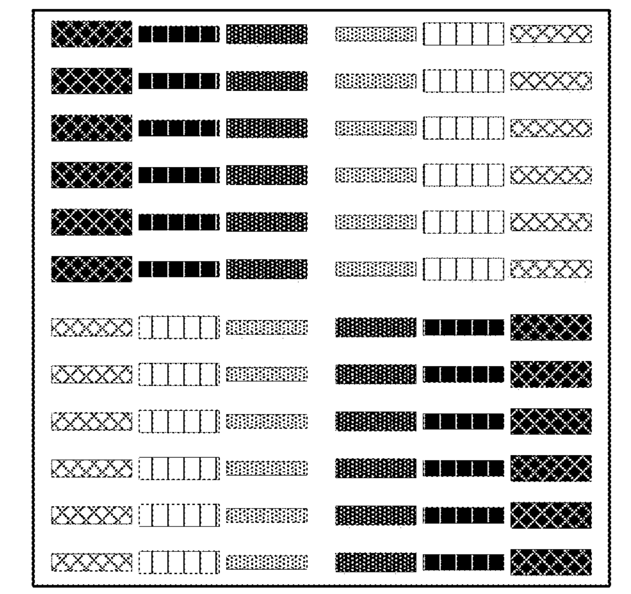

FIGS. 3A-B illustrate examples of separate 1D marks 310, 320 for x and y overlay measurements across three layers with multiple measurement features or patterns to choose from per layer. In particular, FIG. 3A shows a 1D mark 310 for measuring overlay in the x direction, and FIG. 3B shows a 1D mark 320 for measuring overlay in the y direction, as described further below.

In the illustrated example, 1D overlay marks 310, 320 are similar to 1D overlay marks 210, 220 of FIGS. 2A-B, except 1D marks 310, 320 have been extended to support overlay measurements across three layers instead of only two, with two patterns to choose from per layer. In this manner, 1D overlay marks 310, 320 enable overlay to be measured in the x and y directions across three layers, with two pattern options per layer and per direction.

In FIG. 3A, the 1D mark 310 for the x overlay measurement includes two vertical grating patterns 311, 312 on the first layer ($X_{1,1}$ and $X_{1,2}$), two vertical grating patterns 313, 314 on the second layer ($X_{2,1}$ and $X_{2,2}$), and two vertical grating patterns 315, 316 on the third layer ($X_{3,1}$ and $X_{3,2}$). The $X_{1,1}$ and $X_{1,2}$ patterns represent different measurement options on the first layer, the $X_{2,1}$ and $X_{2,2}$ patterns represent different measurement options on the second layer, and the $X_{3,1}$ and $X_{3,2}$ patterns represent different measurement options on the third layer. In this manner, the x overlay measurement can be performed using one measurement pattern from each layer, thus providing a variety of possible combinations to choose from. As a result, an optimal set of patterns can be selected across the three layers to maximize the accuracy of the x overlay measurement.

In FIG. 3B, the 1D mark 320 for the y overlay measurement includes two horizontal grating patterns 321, 322 on the first layer ($Y_{1,1}$ and $Y_{1,2}$), two horizontal grating patterns 323, 324 on the second layer ($Y_{2,1}$ and $Y_{2,2}$), and two horizontal grating patterns 325, 326 on the third layer ($Y_{3,1}$ and $Y_{3,2}$). The $Y_{1,1}$ and $Y_{1,2}$ patterns represent different measurement options on the first layer, the $Y_{2,1}$ and $Y_{2,2}$ patterns represent different measurement options on the second layer, and the $Y_{3,1}$ and $Y_{3,2}$ patterns represent different measurement options on the third layer. In this manner, similar to the x overlay measurement, the y overlay measurement can be performed using an optimal combination of patterns selected across the three layers to maximize accuracy.

Figure 4C:
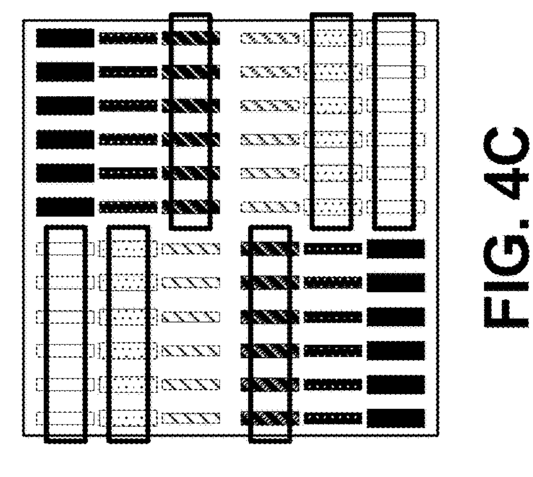
FIGS. 4A-C illustrate examples of different combinations of measurement features available in a 1D overlay mark.
Figure 4B:
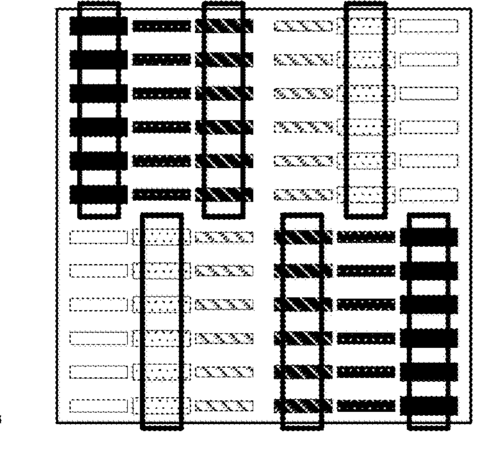
Figure 4A:
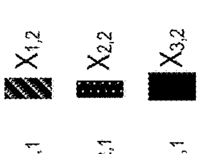
Figure 4A:
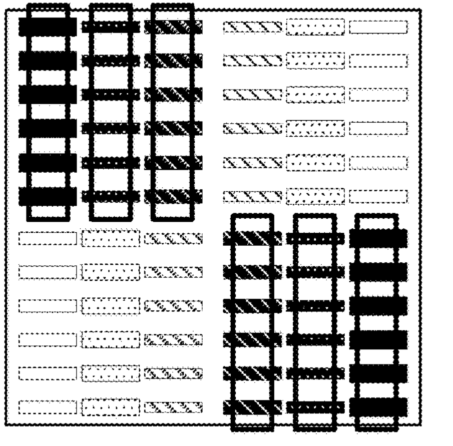

FIGS. 4A-C illustrate examples of different combinations of measurement features available in a 1D overlay mark. The example combinations are from the 1D mark 310 of FIG. 3A, which is for measuring overlay in the x direction.

As described above, the x overlay measurement can be performed by selecting one measurement feature from each layer of mark 310 using any combination of the available measurement features on each layer. Three different combinations of measurement features are shown in FIGS. 4A-C. In FIG. 4A, the selected measurement features include $X_{1,2}$ (layer 1, pattern 2), $X_{2,2}$ (layer 2, pattern 2), and $X_{3,2}$ (layer 3, pattern 2). In FIG. 4B, the selected measurement features include $X_{1,2}$ (layer 1, pattern 2), $X_{2,1}$ (layer 2, pattern 1), and $X_{3,2}$ (layer 3, pattern 2). In FIG. 4C, the selected measurement features include $X_{1,2}$ (layer 1, pattern 2), $X_{2,1}$ (layer 2, pattern 1), and $X_{3,1}$ (layer 3, pattern 1). These combinations are merely shown as examples—other combination are also possible.

Figure 5:
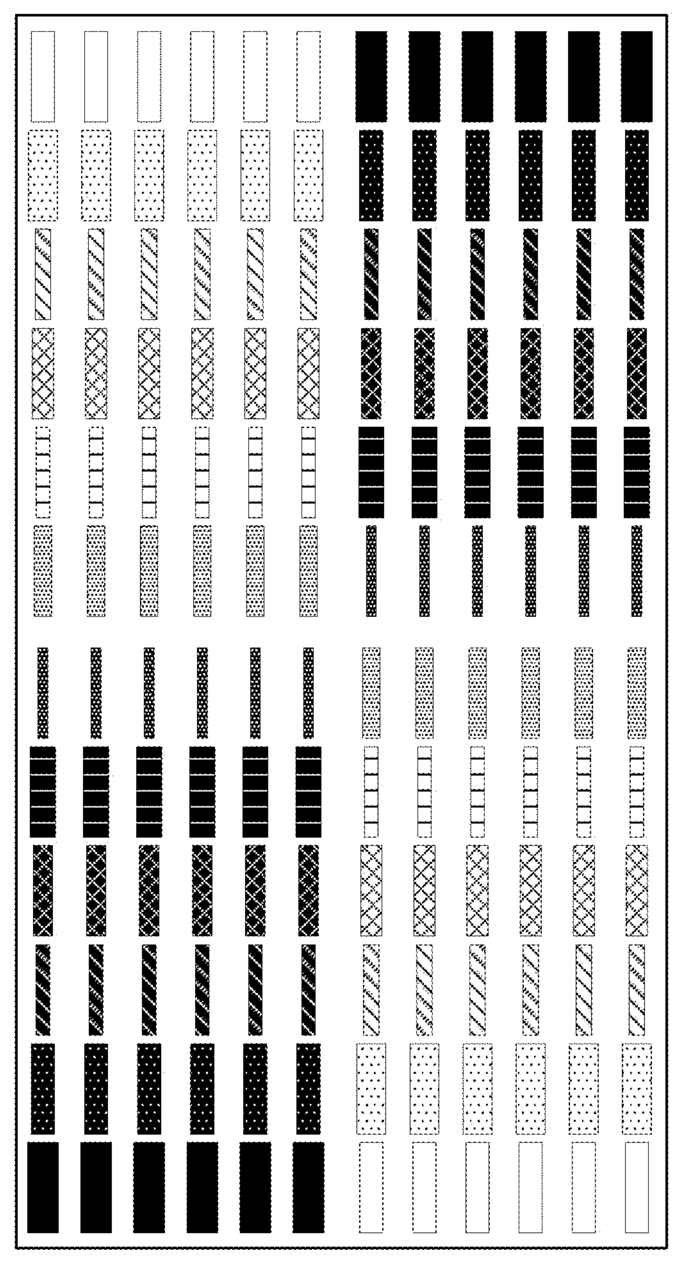
FIG. 5 illustrates an example of a 1D mark for measuring overlay in the y direction across six layers with multiple measurement options per layer.
Figure 5:
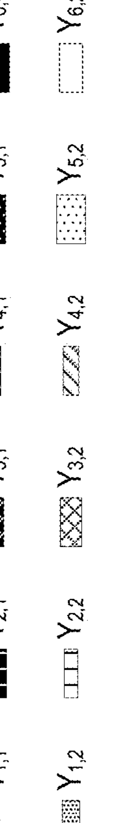
Figure 5:
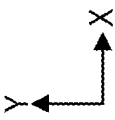

FIG. 5 illustrates an example of a 1D mark 500 for measuring overlay in the y direction across six layers with two measurement features to choose from per layer. In the illustrated example, overlay mark 500 is similar to other 1D marks described herein, except overlay mark 500 has been extended to support overlay measurements across six layers/reticles, with two measurement features or patterns to choose from per layer. Further, while overlay mark 500 is for measuring overlay in the y direction, a 1D overlay mark for measuring overlay in the x direction would be similar but with 90 degrees of rotation.

In the illustrated example, 1D mark 500 includes two horizontal grating patterns on each of the first layer ($Y_{1,1}$ and $Y_{1,2}$), the second layer ($Y_{2,1}$ and $Y_{2,2}$), the third layer ($Y_{3,1}$ and $Y_{3,2}$), the fourth layer ($Y_{4,1}$ and $Y_{4,2}$), the fifth layer ($Y_{5,1}$ and $Y_{5,2}$), and the sixth layer ($Y_{6,1}$ and $Y_{6,2}$). The grating patterns on the same layer (e.g., $Y_{1,1}$ and $Y_{1,2}$, $Y_{2,1}$ and $Y_{2,2}$, etc.) represent different measurement options for that layer. In this manner, the y overlay measurement can be performed using an optimal combination of patterns selected across the six layers to maximize accuracy.

While various example 1D overlay marks have been shown and described herein for overlay measurements across two, three, and six layers, these 1D marks are easily extendable to any number of layers/reticles, limited only by the available space on the wafer and the imaging capabilities of the measurement tool.

Figure 6A:
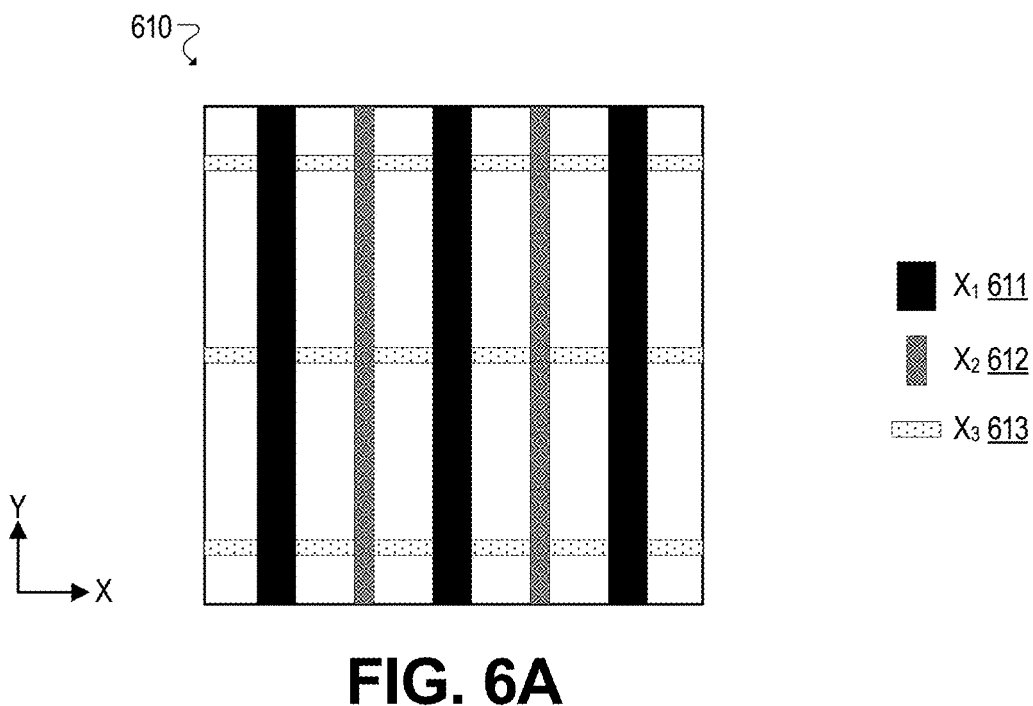
FIGS. 6A-B illustrate examples of separate 1D marks for x and y e-beam overlay measurements across two layers.
Figure 6B:
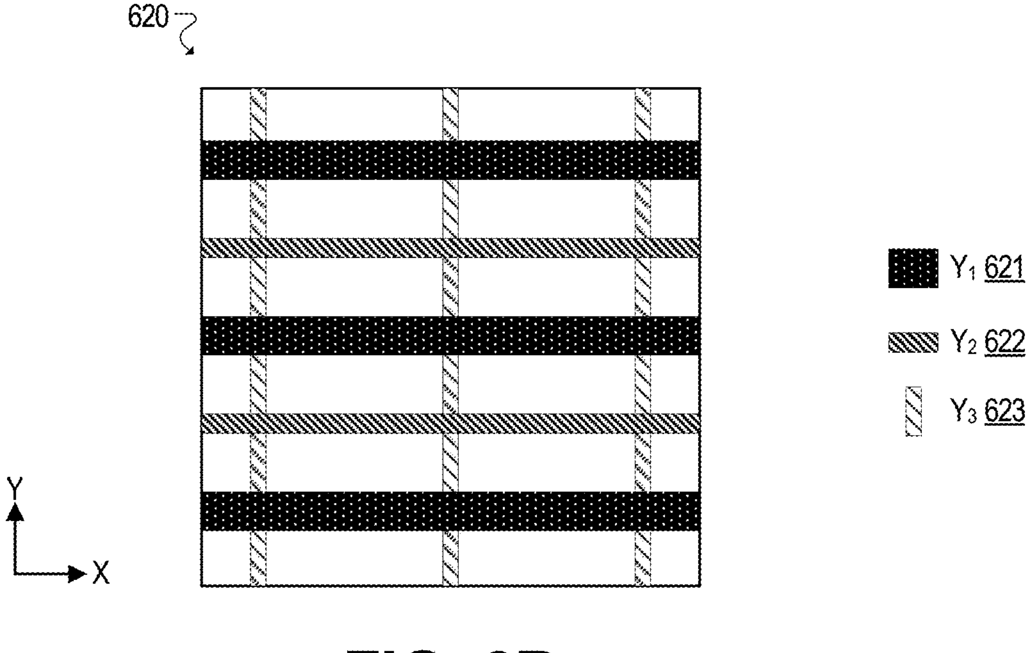

FIGS. 6A-B illustrate examples of separate 1D marks 610, 620 for x and y e-beam overlay measurements across two layers. In particular, FIG. 6A shows a 1D mark 610 for measuring overlay in the x direction, and FIG. 6B shows a 1D mark 620 for measuring overlay in the y direction. In some embodiments, these 1D marks 610, 620 may be used with e-beam overlay techniques.

In FIG. 6A, the 1D mark 610 for measuring overlay in the x direction includes interleaving patterns across multiple layers. In particular, overlay mark 610 includes a vertical line pattern 611 on a first layer, referred to as $X_1$, a vertical line pattern 612 on a second layer, referred to as $X_2$, and a horizontal line pattern 613 on a third layer, referred to as $X_3$. Moreover, the $X_1$, $X_2$, and $X_3$ patterns may have different characteristics, such as size, dimensions, spacing, pitch, duty cycle, and so forth.

The $X_1$ and $X_2$ patterns on the first and second layers are interleaving patterns oriented vertically, or perpendicular to the x axis (e.g., the axis of measurement), and are used to measure overlay between the first and second layers in the x direction (e.g., using e-beam overlay techniques).

The $X_3$ pattern represents a background pattern on one or more additional layers, which is not needed for the overlay measurement, but may be included in the design to make overlay mark 610 compatible with the integrated process (e.g., to satisfy the pattern density requirements for chemical mechanical processing (CMP)). Further, since the $X_3$ pattern is not needed for the overlay measurement, it has a horizontal orientation perpendicular to the $X_1$ and $X_2$ patterns to avoid interfering with the measurement.

In FIG. 6B, the 1D mark 620 for measuring overlay in the y direction similarly includes interleaving patterns across multiple layers. In particular, overlay mark 620 includes a horizontal line pattern 621 on a first layer, referred to as $Y_1$, a horizontal line pattern 622 on a second layer, referred to as $Y_2$, and a vertical line pattern 623 on a third layer, referred to as $Y_3$. Moreover, the $Y_1$, $Y_2$, and $Y_3$ patterns may have different characteristics, such as size, dimensions, spacing, pitch, duty cycle, and so forth.

The $Y_1$ and $Y_2$ patterns on the first and second layers are interleaving patterns oriented horizontally, or perpendicular to the y axis (e.g., the axis of measurement), and are used to measure overlay between the first and second layers in the y direction (e.g., using e-beam overlay techniques).

The $Y_3$ pattern represents a background pattern on one or more additional layers, which is not needed for the overlay measurement, but may be included in the design to make overlay mark 620 compatible with the integrated process. Further, since the $Y_3$ pattern is not needed for the overlay measurement, it has a vertical orientation perpendicular to the $Y_1$ and $Y_2$ patterns to avoid interfering with the measurement.

The patterns on each layer of marks 610, 620 may be formed by the same reticle. For example, the $X_1$ and $Y_1$ patterns 611, 621 on the first layer may be formed by the same reticle, the $X_2$ and $Y_2$ patterns 612, 622 on the second layer may be formed by the same reticle, and the $X_3$ and $Y_3$ patterns 613, 623 on the third layer may be formed by the same reticle.

In the illustrated embodiment, each 1D mark 610, 620 only includes one pattern or measurement feature per layer for the overlay measurement (e.g., $X_1$ on the first layer and $X_2$ on the second layer for the x measurement, and $Y_1$ on the first layer and $Y_2$ on the second layer for the y measurement). In other embodiments, however, the 1D marks 610, 620 may include multiple patterns to choose from per layer, similar to other 1D mark designs described herein (e.g., the overlay marks of FIGS. 2-5 and 7).

Further, in some embodiments, other 1D mark designs disclosed herein for image-based overlay and diffraction-based overlay (e.g., overlay marks of FIGS. 1-5 and 7-8) may include background patterns similar to those in overlay marks 610, 620 (e.g., $X_3$ and $Y_3$).

Figure 7:
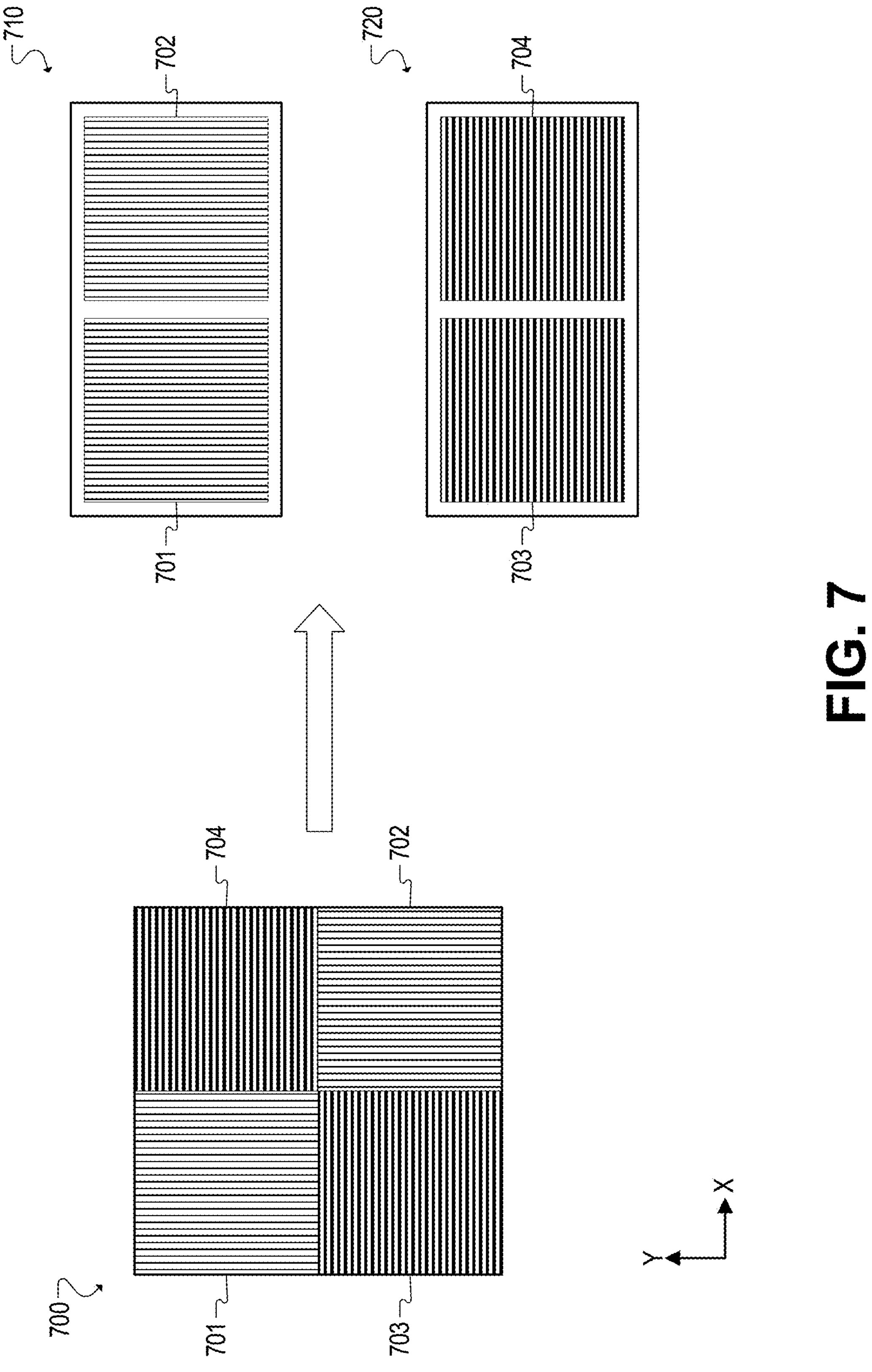
FIG. 7 illustrates an example of decomposing a 2D scatterometry overlay mark into separate 1D marks.

FIG. 7 illustrates an example of decomposing a 2D scatterometry overlay (SCOL) mark 700 into separate 1D marks 710, 720 for overlay measurements in the x and y directions, respectively. In some embodiments, the decomposed 1D marks 710, 720 may be used with diffraction-based overlay techniques.

Diffraction-based overlay (DBO) techniques measure overlay errors based on diffraction intensities of stacked periodic structures or "gratings," such as two grating patterns in different layers that are stacked or superimposed on top of each other, which may be referred to as scatterometry overlay (SCOL) patterns. In particular, an overlay error between two stacked grating patterns changes their diffraction intensities, and as a result, the overlay error can be measured by detecting the change in diffraction intensities.

An example of a 2D SCOL mark 700 is shown in FIG. 7. In the illustrated example, SCOL mark 700 includes two "pads" 701, 702 for measuring overlay in the x direction and two "pads" 703, 704 for measuring overlay in the y direction. The pads 701, 702 for the x overlay measurement are designed with vertical grating patterns (e.g., perpendicular to the x axis), and the pads 703, 704 for the y overlay measurement are designed with horizontal grating patterns (e.g., perpendicular to the y axis).

Each pad 701-704 includes a pair of identical gratings stacked one on top of the other (with a slight offset), which are patterned in different layers by different reticles. For example, one grating may be printed by a reticle for the current layer, and the other grating may be printed by a reticle for another "align-to" layer.

Further, while the two gratings are overlaid on each other, they are overlaid with an intentional offset, which creates an imbalance in the +/−$1^{st}$ order diffraction. Moreover, this offset is different for the two pads used to measure overlay in a given direction. For example, with respect to the pads 701, 702 used for the x overlay measurement, the two grating patterns in pad 701 are overlaid with a different offset than the two grating patterns in pad 702. As a result, the imbalance in the +/−$1^{st}$ order diffraction is different for the two pads 701, 702 used for the x overlay measurement. The same is true for the two pads 703, 704 used for the y overlay measurement.

In the presence of overlay error in a given direction, the imbalance between the +/−$1^{st}$ order diffraction changes for each pad. As a result, overlay can be determined by comparing the relative change in imbalance for the two pads used for a given direction (e.g., pads 701 and 702 for the x overlay measurement, and pads 703 and 704 for the y overlay measurement).

The use of two pads in a given direction (rather than only one) enables the overlay error to be unambiguously determined. For example, with only a single pad, the presence of an overlay error can be detected based on a shift in intensity between the +/−$1^{st}$ order diffractions for that pad, but that shift is only useful as a relative monitor—it does not enable the actual overlay error to be determined.

In the illustrated example, the 2D mark 700 includes pads for measuring overlay in both the x and y directions. For example, the 2D mark 700 includes a pair of pads 701, 702 for the x overlay measurements and a pair of pads 702, 703 for the y overlay measurement. This 2D design suffers from the same drawbacks discussed in connection with other 2D designs. For example, 2D mark 700 only provides one pair of measurement features (e.g., pads) for each direction, thus providing no flexibility to choose different features for each direction. Further, even if multiple 2D marks with different measurement features are provided as options for performing the same overlay measurement, there is no guarantee that the best features for each direction will be in the same mark.

Accordingly, in the illustrated example, the 2D SCOL mark 700 is decomposed into two physically separate 1D marks 710, 720 for the respective x and y directions. For example, 1D mark 710 includes pads 701 and 702 for measuring overlay in the x direction, and 1D mark 720 includes pads 703 and 704 for measuring overlay in the y direction. In this manner, the two 1D marks 710, 720 collectively contain the same information as the original 2D mark 700. However, when multiple measurement feature pairs (e.g., pairs of pads) are provided for each direction in one or more 1D marks (e.g., as shown in FIGS. 8A-B), the 1D marks provide the freedom to select the best measurement feature pairs in the x direction and the y direction independently.

Figure 8A:
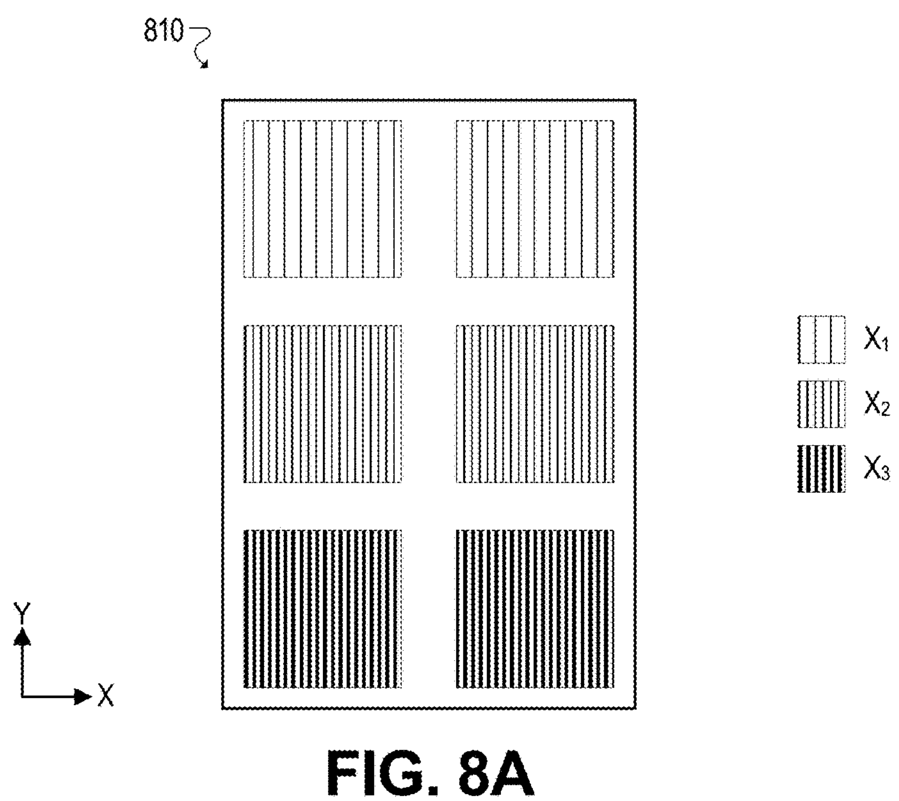
FIGS. 8A-B illustrate examples of separate 1D scatterometry marks for x and y overlay measurements across two layers with multiple measurement options for each direction.
Figure 8B:
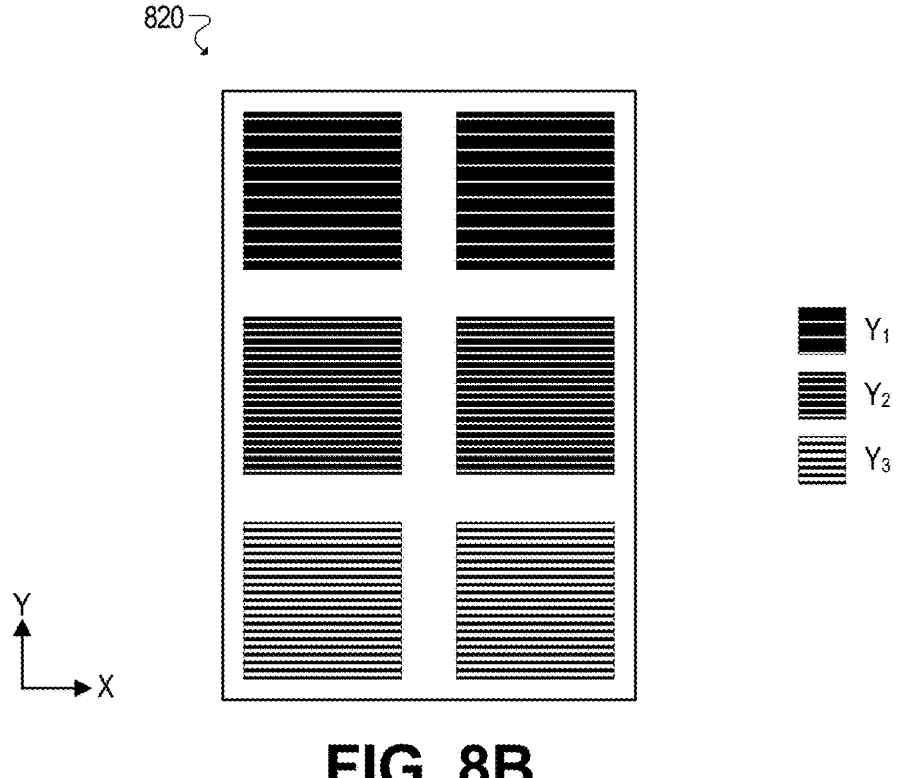

FIGS. 8A-B illustrate examples of separate 1D scatterometry marks 810, 820 for x and y overlay measurements across two layers with multiple measurement feature pairs to choose from for each direction. In some embodiments, 1D marks 810, 820 may be used with diffraction-based overlay techniques.

In the illustrated example, FIG. 8A shows a 1D mark 810 with three different measurement feature pairs, referred to as $X_1$, $X_2$, and $X_3$, for measuring overlay in the x direction. Similarly, FIG. 8B shows a 1D mark 820 with three different measurement feature pairs, referred to as $Y_1$, $Y_2$, and $Y_3$, for measuring overlay in the y direction. Each measurement feature pair represents a pair of pads, where each pad includes two stacked gratings patterned in different layers, as described in connection with FIG. 7.

For example, $X_1$, $X_2$, and $X_3$ each represent a pair of pads similar to pads 701 and 702 in FIG. 7, but $X_1$, $X_2$, and $X_3$ each have different grating characteristics (e.g., pitch, duty cycle) for measuring overlay in the x direction. Similarly, $Y_1$, $Y_2$, and $Y_3$ each represent a pair of pads similar to pads 703 and 704 in FIG. 7, but $Y_1$, $Y_2$, and $Y_3$ each have different grating characteristics (e.g., pitch, duty cycle) for measuring overlay in the y direction.

In this manner, the x and y overlay measurements can be performed using any combination of x and y measurement features, such as $X_1$ and $Y_1$, $X_1$ and $Y_2$, $X_1$ and $Y_3$, $X_2$ and $Y_1$, $X_2$ and $Y_2$, and so forth. As a result, an optimal combination of features can be selected for the x and y overlay measurements to maximize accuracy. Further, while 1D marks 810, 820 provide three features to choose from for each of the x and y directions, these 1D marks can be extended to include any number of measurement feature pairs per direction.

Figure 9:
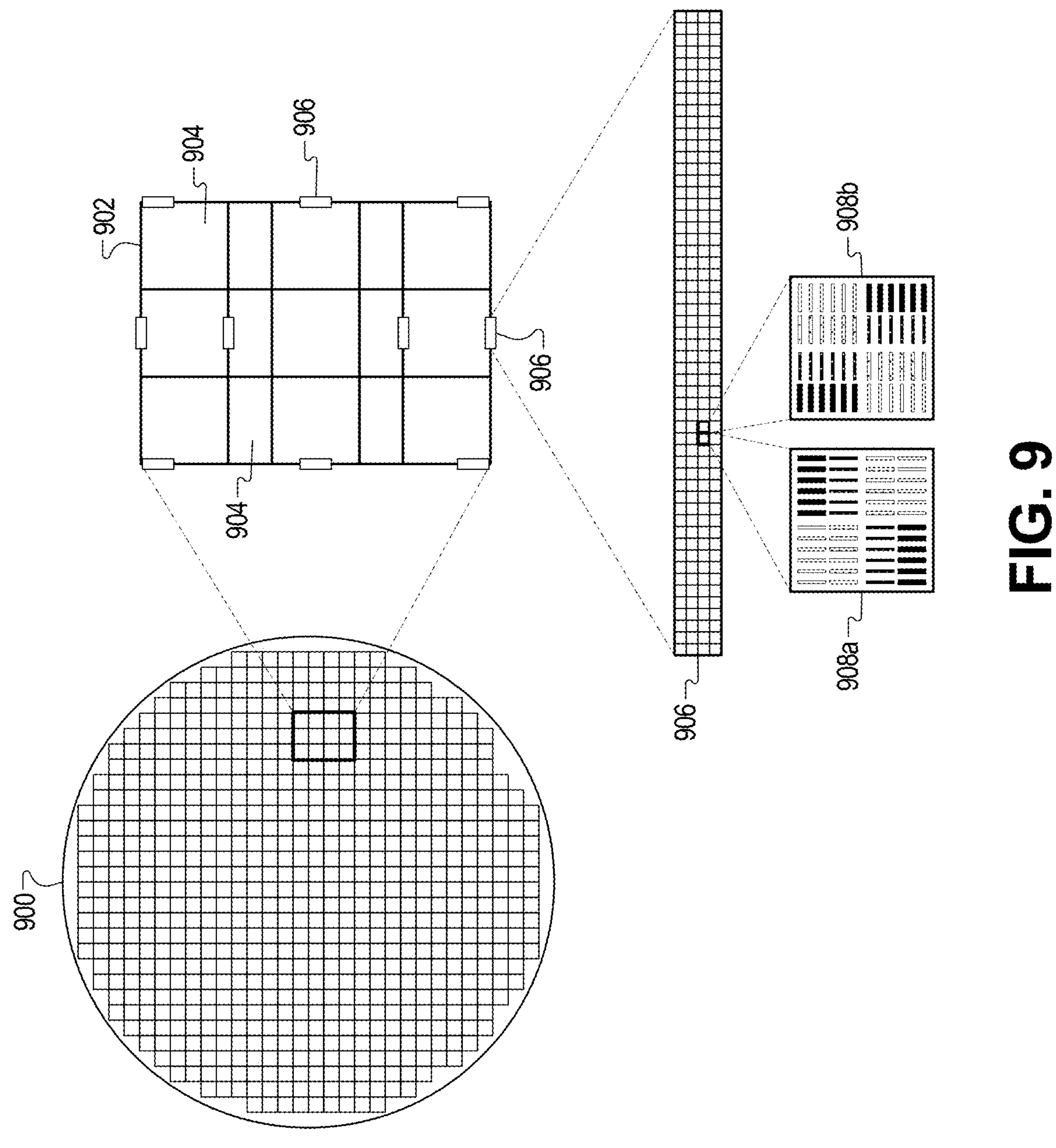
FIG. 9 illustrates an example of a wafer with 1D overlay marks in accordance with certain embodiments.

FIG. 9 illustrates an example of a wafer 900 with one-dimensional (1D) overlay marks in accordance with certain embodiments. In the illustrated embodiment, wafer 900 includes a collection of integrated circuit (IC) dies 904. Further, a reticle-level layout 902 of the IC dies 904 is shown, which depicts an example layout of the IC dies 904 on the wafer 900 at the reticle level. The reticle-level layout 902 includes a set of IC dies 904, along with overlay parent blocks 906 placed throughout the scribe line. In the illustrated example, the reticle-level layout 902 includes ten placements of the overlay parent block 906. In some embodiments, each overlay parent block 906 includes the collection of all overlay marks 908 for all layers or steps of the fabrication process.

Examples of two 1D overlay marks 908*a-b* in the overlay parent block 906 are shown. In the illustrated example, the 1D overlay marks 908*a-b* are separate marks with targets for the x and y directions, respectively, for certain layers or steps of the fabrication process. For example, the 1D overlay marks 908*a-b* include a 1D mark 908*a* for measurements in the x direction and a separate 1D mark 908*b* for measurement in the y direction. Moreover, each mark 908*a-b* includes multiple patterns or measurement features to choose from for each layer. In some embodiments, for example, 1D overlay marks 908*a-b* may be similar to the overlay marks from FIGS. 2A-B.

Figure 10:
FIG. 10 illustrates a flowchart for measuring overlay using 1D marks in accordance with certain embodiments.
Figure 10:
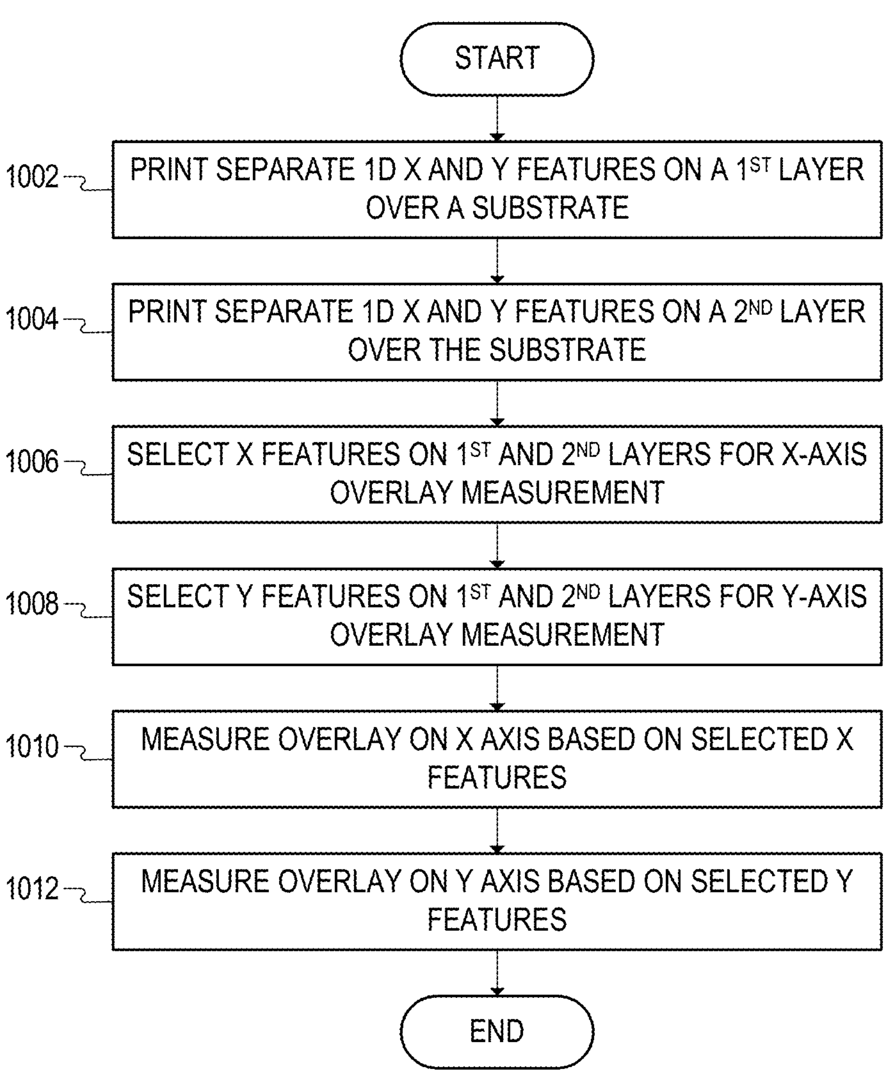

FIG. 10 illustrates a flowchart 1000 for measuring overlay using one-dimensional (1D) marks in accordance with certain embodiments. It will be appreciated in light of the present disclosure that flowchart 1000 is only one example methodology for forming 1D overlay marks and measuring overlay based on those marks.

In some embodiments, flowchart 1000 may be used to print 1D overlay marks on a substrate or wafer to measure overlay during a semiconductor fabrication process. Moreover, the wafer may subsequently be singulated into semiconductor dies, and each semiconductor die may then be packaged with other components. For example, a package substrate may electrically coupled to a each semiconductor die, and a printed circuit board may be coupled to the package substrate.

The steps of flowchart 1000 may be performed using any suitable semiconductor fabrication techniques. For example, film deposition—such as depositing layers, filling portions of or openings in layers (e.g., removed portions)—may be performed using any suitable deposition techniques, including, for example, chemical vapor deposition (CVD), metalorganic chemical vapor deposition (MOCVD), molecular beam epitaxy (MBE) atomic layer deposition (ALD), and/or physical vapor deposition (PVD). Moreover, patterning and removal steps may be performed using any suitable techniques, such as lithography-based patterning/masking and/or etching.

The flowchart begins at block 1002, where separate 1D features for x and y overlay measurements are printed on a first layer over a substrate (e.g., using a first reticle). For example, a first feature for measuring overlay along a first axis (e.g., the x axis) may be printed on the first layer in a first location over the substrate, and a second feature for measuring overlay along a second axis (e.g., the y axis) may be printed on the first layer in a second location over the substrate, where the first and second locations are spatially separate, non-overlapping locations or positions over the substrate. Moreover, the first feature may include one or more patterns (e.g., grating patterns) having a first orientation for the overlay measurement along the first axis, and the second feature may include one or more patterns (e.g., grating patterns) having a second orientation for the overlay measurement along the second axis, where the first and second orientations are substantially orthogonal to each other.

Further, the first axis and the second axis may correspond to different dimensions and may be substantially orthogonal to each other. For example, the first axis may be the x axis and the second axis may be the y axis. Moreover, the first orientation for the x overlay measurement may be vertical (e.g., perpendicular to the x axis), and the second orientation for the y overlay measurement may be horizontal (e.g., perpendicular to the y axis).

In some embodiments, the first feature may include a first set of patterns on the first layer in the first orientation, and the second feature may include a second set of patterns on the first layer in the second orientation. For example, the patterns may be grating patterns oriented either vertically or horizontally. Moreover, at least some of the grating patterns may have different designs, layouts, characteristics, and/or measurement features (e.g., pitch, duty cycle).

The flowchart then proceeds to block 1004, where separate 1D features for x and y overlay measurements are printed on a second layer over the substrate (e.g., using a second reticle). For example, a third feature for measuring overlay along the first axis (e.g., x axis) may be printed on the second layer in the first location over the substrate, and a fourth feature for measuring overlay along the second axis (e.g., y axis) may be printed on the second layer in the second location over the substrate. Moreover, the third feature may include one or more patterns (e.g., grating patterns) having the first orientation for the overlay measurement along the first axis, and the fourth feature may include one or more patterns (e.g., grating patterns) having the second orientation for the overlay measurement along the second axis.

In some embodiments, the third feature may include a third set of patterns on the second layer in the first orientation, and the fourth feature may include a fourth set of patterns on the second layer in the second orientation. For example, the patterns may be grating patterns oriented either vertically or horizontally. Moreover, at least some of the grating patterns may have different designs, layouts, characteristics, and/or measurement features (e.g., pitch, duty cycle).

The flowchart then proceeds to block 1006 to select features/patterns on the first and second layers for the x-axis overlay measurement, and then to block 1008 to select features/patterns on the first and second layers for the y-axis overlay measurement. For example, an optimal combination of x and y measurement patterns may be selected from the first and second layers to maximize overlay measurement accuracy.

The flowchart then proceeds to block 1010 to measure overlay on the first axis (e.g., x axis) based on the selected features from block 1006. For example, an overlay error between the first and second layers may be computed along the x axis based on at least one measurement feature/pattern in the vertical orientation on each of the first and second layers.

In some embodiments, for example, the selected features on the first and second layers may be patterns (e.g., grating patterns) with 180° symmetry. Moreover, the center of symmetry may be computed for each pattern, and the overlay error may then be computed based on the difference between the center of symmetry for the respective patterns.

The flowchart then proceeds to block 1012 to measure overlay on the second axis (e.g., y axis) based on the selected features from block 1008. For example, an overlay error between the first and second layers may be computed along the y axis based on at least one measurement feature/pattern in the horizontal orientation on each of the first and second layers.

In some embodiments, for example, the selected features on the first and second layers may be patterns (e.g., grating patterns) with 180° symmetry. Moreover, the center of symmetry may be computed for each pattern, and the overlay error may then be computed based on the difference between the center of symmetry for the respective patterns.

At this point, the flowchart may be complete. In some embodiments, however, the flowchart may restart and/or certain blocks may be repeated. For example, in some embodiments, the flowchart may restart at block 1002 to continue measuring overlay for additional layers printed on the substrate.

Example Integrated Circuit Embodiments

Figure 11:
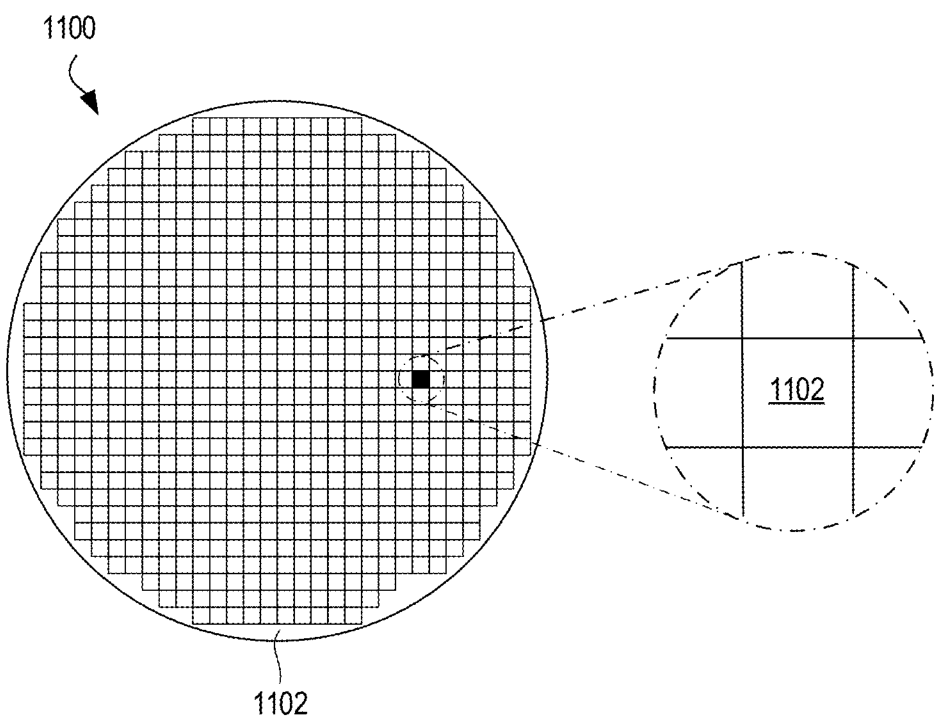
FIG. 11 is a top view of a wafer and dies that may be included in a microelectronic assembly, in accordance with any of the embodiments disclosed herein.

FIG. 11 is a top view of a wafer 1100 and dies 1102 that may be included in any of the embodiments disclosed herein. The wafer 1100 may be composed of semiconductor material and may include one or more dies 1102 having integrated circuit structures formed on a surface of the wafer 1100. The individual dies 1102 may be a repeating unit of an integrated circuit product that includes any suitable integrated circuit. After the fabrication of the semiconductor product is complete, the wafer 1100 may undergo a singulation process in which the dies 1102 are separated from one another to provide discrete “chips” of the integrated circuit product. The die 1102 may be any of the dies disclosed herein. The die 1102 may include one or more transistors (e.g., some of the transistors 1240 of FIG. 12, discussed below), supporting circuitry to route electrical signals to the transistors, passive components (e.g., signal traces, resistors, capacitors, or inductors), and/or any other integrated circuit components. In some embodiments, the wafer 1100 or the die 1102 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processor unit (e.g., the processor unit 1402 of FIG. 14) or other logic that is configured to store information in the memory devices or execute instructions stored in the memory array. Various ones of the microelectronic assemblies disclosed herein may be manufactured using a die-to-wafer assembly technique in which some dies are attached to a wafer 1100 that include others of the dies, and the wafer 1100 is subsequently singulated.

Figure 12:
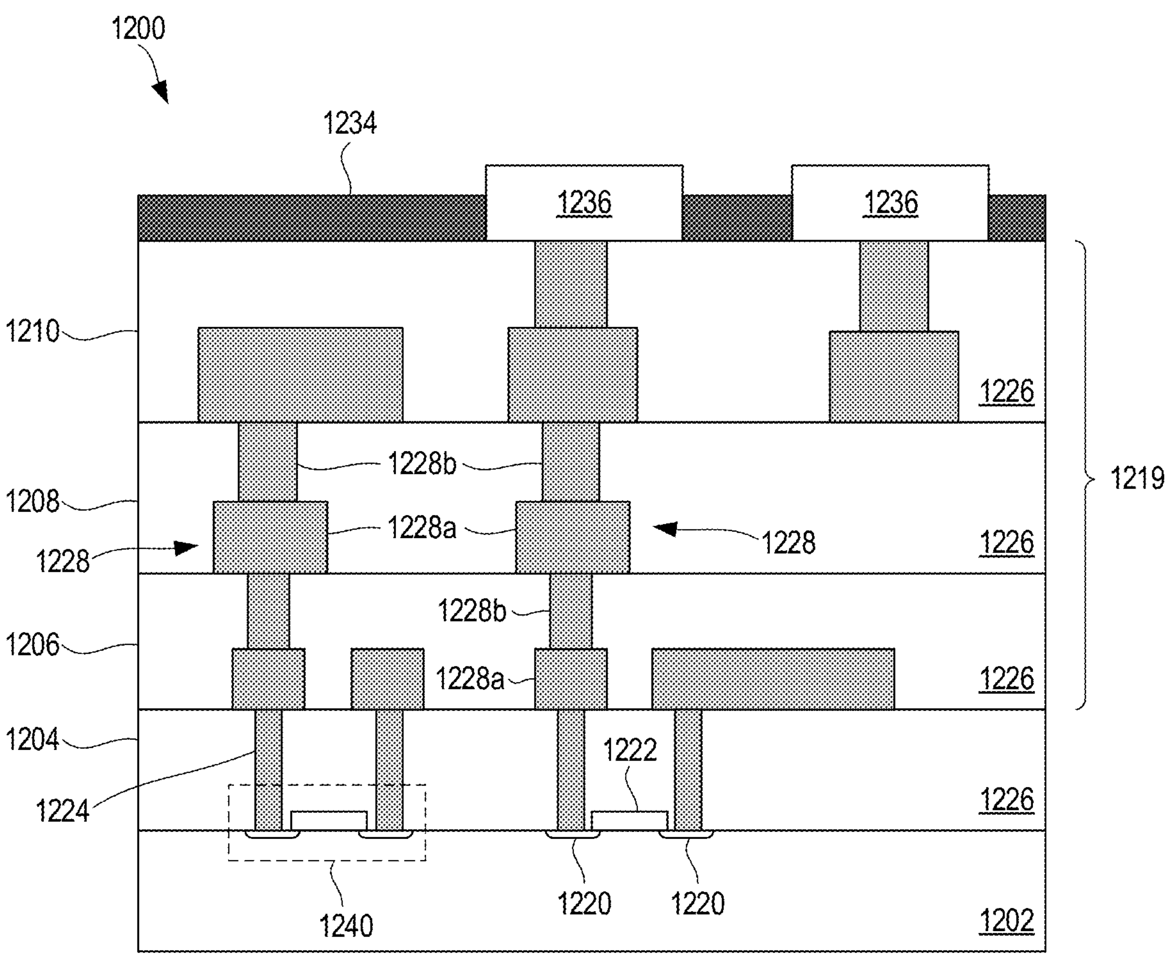
FIG. 12 is a cross-sectional side view of an integrated circuit device that may be included in a microelectronic assembly, in accordance with any of the embodiments disclosed herein.

FIG. 12 is a cross-sectional side view of an integrated circuit device 1200 that may be included in any of the embodiments disclosed herein (e.g., in any of the dies). One or more of the integrated circuit devices 1200 may be included in one or more dies 1102 (FIG. 11). The integrated circuit device 1200 may be formed on a die substrate 1202 (e.g., the wafer 1100 of FIG. 11) and may be included in a die (e.g., the die 1102 of FIG. 11). The die substrate 1202 may be a semiconductor substrate composed of semiconductor material systems including, for example, n-type or p-type materials systems (or a combination of both). The die substrate 1202 may include, for example, a crystalline substrate formed using a bulk silicon or a silicon-on-insulator (SOI) substructure. In some embodiments, the die substrate 1202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1202. Although a few examples of materials from which the die substrate 1202 may be formed are described here, any material that may serve as a foundation for an integrated circuit device 1200 may be used.

The die substrate 1202 may be part of a singulated die (e.g., the dies 1102 of FIG. 11) or a wafer (e.g., the wafer 1100 of FIG. 11).

The integrated circuit device 1200 may include one or more device layers 1204 disposed on the die substrate 1202. The device layer 1204 may include features of one or more transistors 1240 (e.g., metal oxide semiconductor field-effect transistors (MOSFETs)) formed on the die substrate 1202. The transistors 1240 may include, for example, one or more source and/or drain (S/D) regions 1220, a gate 1222 to control current flow between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 12 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 12, a transistor 1240 may include a gate 1222 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1240 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1240 along the source-channel-drain direction, the gate electrode may consist of a U-shaped structure that includes a bottom portion substantially parallel to the surface of the die substrate 1202 and two sidewall portions that are substantially perpendicular to the top surface of the die substrate 1202. In other embodiments, at least one of the metal layers that form the gate electrode may simply be a planar layer that is substantially parallel to the top surface of the die substrate 1202 and does not include sidewall portions substantially perpendicular to the top surface of the die substrate 1202. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1220 may be formed within the die substrate 1202 adjacent to the gate 1222 of individual transistors 1240. The S/D regions 1220 may be formed using an implantation/diffusion process or an etching/deposition process, for example. In the former process, dopants such as boron, aluminum, antimony, phosphorous, or arsenic may be ion-implanted into the die substrate 1202 to form the S/D regions 1220. An annealing process that activates the dopants and causes them to diffuse farther into the die substrate 1202 may follow the ion-implantation process. In the latter process, the die substrate 1202 may first be etched to form recesses at the locations of the S/D regions 1220. An epitaxial deposition process may then be carried out to fill the recesses with material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220.

Electrical signals, such as power and/or input/output (I/O) signals, may be routed to and/or from the devices (e.g., transistors 1240) of the device layer 1204 through one or more interconnect layers disposed on the device layer 1204 (illustrated in FIG. 12 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1210 may form a metallization stack (also referred to as an "ILD stack") 1219 of the integrated circuit device 1200.

The interconnect structures 1228 may be arranged within the interconnect layers 1206-1210 to route electrical signals according to a wide variety of designs; in particular, the arrangement is not limited to the particular configuration of interconnect structures 1228 depicted in FIG. 12. Although a particular number of interconnect layers 1206-1210 is depicted in FIG. 12, embodiments of the present disclosure include integrated circuit devices having more or fewer interconnect layers than depicted.

In some embodiments, the interconnect structures 1228 may include lines 1228*a* and/or vias 1228*b* filled with an electrically conductive material such as a metal. The lines 1228*a* may be arranged to route electrical signals in a direction of a plane that is substantially parallel with a surface of the die substrate 1202 upon which the device layer 1204 is formed. For example, the lines 1228*a* may route electrical signals in a direction in and out of the page and/or in a direction across the page from the perspective of FIG. 12. The vias 1228*b* may be arranged to route electrical signals in a direction of a plane that is substantially perpendicular to the surface of the die substrate 1202 upon which the device layer 1204 is formed. In some embodiments, the vias 1228*b* may electrically couple lines 1228*a* of different interconnect layers 1206-1210 together.

The interconnect layers 1206-1210 may include a dielectric material 1226 disposed between the interconnect structures 1228, as shown in FIG. 12. In some embodiments, dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same. The device layer 1204 may include a dielectric material 1226 disposed between the transistors 1240 and a bottom layer of the metallization stack as well. The dielectric material 1226 included in the device layer 1204 may have a different composition than the dielectric material 1226 included in the interconnect layers 1206-1210; in other embodiments, the composition of the dielectric material 1226 in the device layer 1204 may be the same as a dielectric material 1226 included in any one of the interconnect layers 1206-1210.

A first interconnect layer 1206 (referred to as Metal 1 or "M1") may be formed directly on the device layer 1204. In some embodiments, the first interconnect layer 1206 may include lines 1228*a* and/or vias 1228*b*, as shown. The lines 1228*a* of the first interconnect layer 1206 may be coupled with contacts (e.g., the S/D contacts 1224) of the device layer 1204. The vias 1228*b* of the first interconnect layer 1206 may be coupled with the lines 1228*a* of a second interconnect layer 1208.

The second interconnect layer 1208 (referred to as Metal 2 or "M2") may be formed directly on the first interconnect layer 1206. In some embodiments, the second interconnect layer 1208 may include via 1228*b* to couple the lines 1228 of the second interconnect layer 1208 with the lines 1228*a* of a third interconnect layer 1210. Although the lines 1228*a* and the vias 1228*b* are structurally delineated with a line within individual interconnect layers for the sake of clarity, the lines 1228*a* and the vias 1228*b* may be structurally and/or materially contiguous (e.g., simultaneously filled during a dual-damascene process) in some embodiments.

The third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206. In some embodiments, the interconnect layers that are "higher up" in the metallization stack 1219 in the integrated circuit device 1200 (i.e., farther away from the device layer 1204) may be thicker that the interconnect layers that are lower in the metallization stack 1219, with lines 1228*a* and vias 1228*b* in the higher interconnect layers being thicker than those in the lower interconnect layers.

The integrated circuit device 1200 may include a solder resist material 1234 (e.g., polyimide or similar material) and one or more conductive contacts 1236 formed on the interconnect layers 1206-1210. In FIG. 12, the conductive contacts 1236 are illustrated as taking the form of bond pads. The conductive contacts 1236 may be electrically coupled with the interconnect structures 1228 and configured to route the electrical signals of the transistor(s) 1240 to external devices. For example, solder bonds may be formed on the one or more conductive contacts 1236 to mechanically and/or electrically couple an integrated circuit die including the integrated circuit device 1200 with another component (e.g., a printed circuit board). The integrated circuit device 1200 may include additional or alternate structures to route the electrical signals from the interconnect layers 1206-1210; for example, the conductive contacts 1236 may include other analogous features (e.g., posts) that route the electrical signals to external components. The conductive contacts 1236 may serve as any of the conductive contacts described throughout this disclosure.

In some embodiments in which the integrated circuit device 1200 is a double-sided die, the integrated circuit device 1200 may include another metallization stack (not shown) on the opposite side of the device layer(s) 1204. This metallization stack may include multiple interconnect layers as discussed above with reference to the interconnect layers 1206-1210, to provide conductive pathways (e.g., including conductive lines and vias) between the device layer(s) 1204 and additional conductive contacts (not shown) on the opposite side of the integrated circuit device 1200 from the conductive contacts 1236. These additional conductive contacts may serve as any of the conductive contacts described throughout this disclosure.

In other embodiments in which the integrated circuit device 1200 is a double-sided die, the integrated circuit device 1200 may include one or more through silicon vias (TSVs) through the die substrate 1202; these TSVs may make contact with the device layer(s) 1204, and may provide conductive pathways between the device layer(s) 1204 and additional conductive contacts (not shown) on the opposite side of the integrated circuit device 1200 from the conductive contacts 1236. These additional conductive contacts may serve as any of the conductive contacts described throughout this disclosure. In some embodiments, TSVs extending through the substrate can be used for routing power and ground signals from conductive contacts on the opposite side of the integrated circuit device 1200 from the conductive contacts 1236 to the transistors 1240 and any other components integrated into the die 1200, and the metallization stack 1219 can be used to route I/O signals from the conductive contacts 1236 to transistors 1240 and any other components integrated into the die 1200.

Multiple integrated circuit devices 1200 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 13:
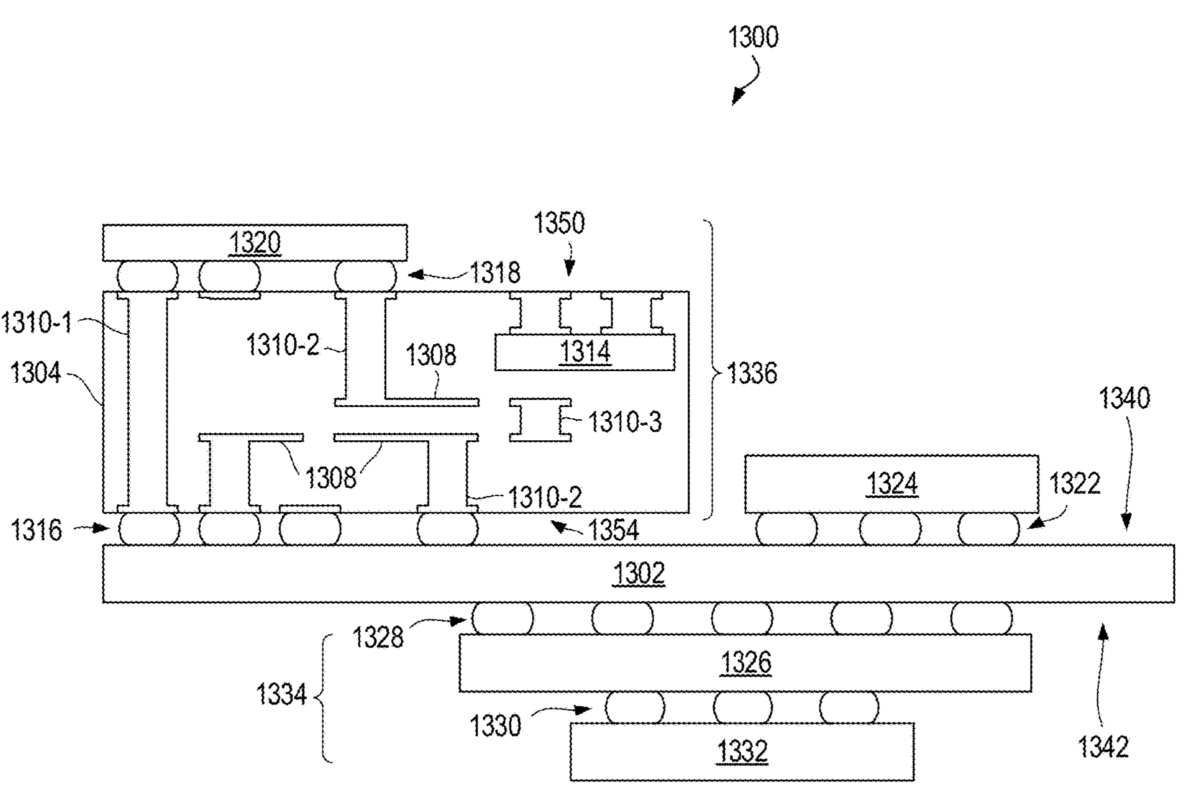
FIG. 13 is a cross-sectional side view of an integrated circuit device assembly that may include a microelectronic assembly, in accordance with any of the embodiments disclosed herein.

FIG. 13 is a cross-sectional side view of an integrated circuit device assembly 1300 that may include any of the embodiments disclosed herein. In some embodiments, the integrated circuit device assembly 1300 may be a microelectronic assembly. The integrated circuit device assembly 1300 includes a number of components disposed on a circuit board 1302 (which may be a motherboard, system board, mainboard, etc.). The integrated circuit device assembly 1300 includes components disposed on a first face 1340 of the circuit board 1302 and an opposing second face 1342 of the circuit board 1302; generally, components may be disposed on one or both faces 1340 and 1342. Any of the integrated circuit components discussed below with reference to the integrated circuit device assembly 1300 may take the form of any suitable ones of the embodiments of the microelectronic assemblies 100 disclosed herein.

In some embodiments, the circuit board 1302 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate. The integrated circuit device assembly 1300 illustrated in FIG. 13 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 13), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 1316 may serve as the coupling components illustrated or described for any of the substrate assembly or substrate assembly components described herein, as appropriate.

The package-on-interposer structure 1336 may include an integrated circuit component 1320 coupled to an interposer 1304 by coupling components 1318. The coupling components 1318 may take any suitable form for the application, such as the forms discussed above with reference to the coupling components 1316. Although a single integrated circuit component 1320 is shown in FIG. 13, multiple integrated circuit components may be coupled to the interposer 1304; indeed, additional interposers may be coupled to the interposer 1304. The interposer 1304 may provide an intervening substrate used to bridge the circuit board 1302 and the integrated circuit component 1320.

The integrated circuit component 1320 may be a packaged or unpacked integrated circuit product that includes one or more integrated circuit dies (e.g., the die 1102 of FIG. 11, the integrated circuit device 1200 of FIG. 12) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1320, a single monolithic integrated circuit die comprises solder bumps attached to contacts on the die. The solder bumps allow the die to be directly attached to the interposer 1304. The integrated circuit component 1320 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1320 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1320 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1320 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as “chiplets”. In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1304 may spread connections to a wider pitch or reroute a connection to a different connection. For example, the interposer 1304 may couple the integrated circuit component 1320 to a set of ball grid array (BGA) conductive contacts of the coupling components 1316 for coupling to the circuit board 1302. In the embodiment illustrated in FIG. 13, the integrated circuit component 1320 and the circuit board 1302 are attached to opposing sides of the interposer 1304; in other embodiments, the integrated circuit component 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through hole vias 1310-1 (that extend from a first face 1350 of the interposer 1304 to a second face 1354 of the interposer 1304), blind vias 1310-2 (that extend from the first or second faces 1350 or 1354 of the interposer 1304 to an internal metal layer), and buried vias 1310-3 (that connect internal metal layers).

In some embodiments, the interposer 1304 can comprise a silicon interposer. Through silicon vias (TSV) extending through the silicon interposer can connect connections on a first face of a silicon interposer to an opposing second face of the silicon interposer. In some embodiments, an interposer 1304 comprising a silicon interposer can further comprise one or more routing layers to route connections on a first face of the interposer 1304 to an opposing second face of the interposer 1304.

The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art. In embodiments where the interposer is a non-printed circuit board The integrated circuit device assembly 1300 may include an integrated circuit component 1324 coupled to the first face 1340 of the circuit board 1302 by coupling components 1322. The coupling components 1322 may take the form of any of the embodiments discussed above with reference to the coupling components 1316, and the integrated circuit component 1324 may take the form of any of the embodiments discussed above with reference to the integrated circuit component 1320.

The integrated circuit device assembly 1300 illustrated in FIG. 13 includes a package-on-package structure 1334 coupled to the second face 1342 of the circuit board 1302 by coupling components 1328. The package-on-package structure 1334 may include an integrated circuit component 1326 and an integrated circuit component 1332 coupled together by coupling components 1330 such that the integrated circuit component 1326 is disposed between the circuit board 1302 and the integrated circuit component 1332. The coupling components 1328 and 1330 may take the form of any of the embodiments of the coupling components 1316 discussed above, and the integrated circuit components 1326 and 1332 may take the form of any of the embodiments of the integrated circuit component 1320 discussed above. The package-on-package structure 1334 may be configured in accordance with any of the package-on-package structures known in the art.

Figure 14:
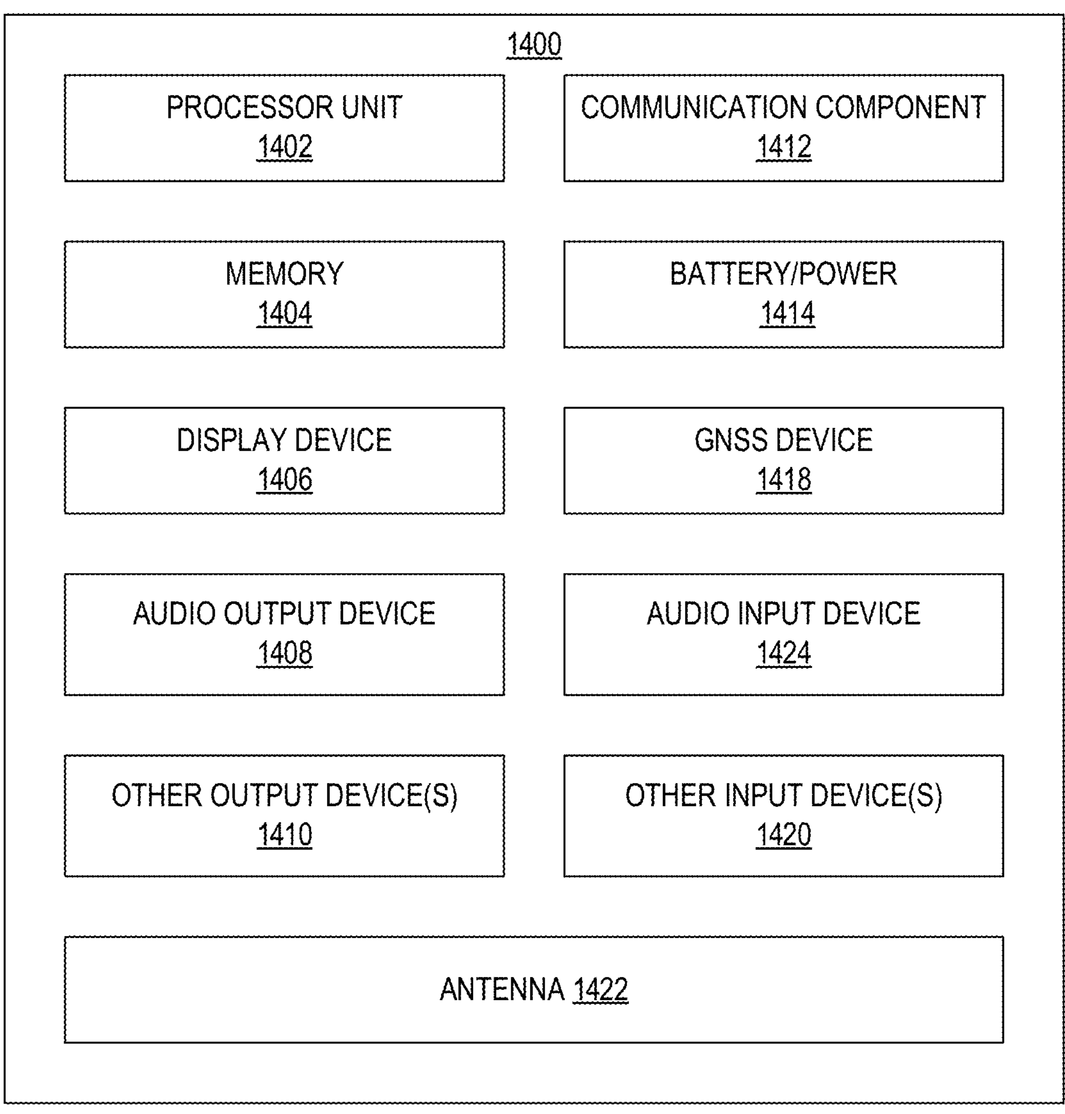
FIG. 14 is a block diagram of an example electrical device that may include a microelectronic assembly, in accordance with any of the embodiments disclosed herein.

FIG. 14 is a block diagram of an example electrical device 1400 that may include one or more of the embodiments disclosed herein. For example, any suitable ones of the components of the electrical device 1400 (e.g., processing circuitry 1402, memory circuitry 1404, communication circuitry 1412) may include one or more 1D overlay marks on one or more integrated circuit dies 1102, integrated circuit device assemblies 1300, integrated circuit components 1320, or integrated circuit devices 1200 disclosed herein. A number of components are illustrated in FIG. 14 as included in the electrical device 1400, but any one or more of these components may be omitted or duplicated, as suitable for the application. In some embodiments, some or all of the components included in the electrical device 1400 may be attached to one or more motherboards mainboards, or system boards. In some embodiments, one or more of these components are fabricated onto a single system-on-a-chip (SoC) die.

Additionally, in various embodiments, the electrical device 1400 may not include one or more of the components illustrated in FIG. 14, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include one or more processor units 1402 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1402 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1400 may include a memory 1404, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1404 may include memory that is located on the same integrated circuit die as the processor unit 1402. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1400 can comprise one or more processor units 1402 that are heterogeneous or asymmetric to another processor unit 1402 in the electrical device 1400. There can be a variety of differences between the processing units 1402 in a system in terms of a spectrum of metrics of merit including architectural, microarchitectural, thermal, power consumption characteristics, and the like. These differences can effectively manifest themselves as asymmetry and heterogeneity among the processor units 1402 in the electrical device 1400.

In some embodiments, the electrical device 1400 may include a communication component 1412 (e.g., one or more communication components). For example, the communication component 1412 can manage wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication component 1412 may manage wired communications, such as electrical, optical, or any other suitable communication protocols (e.g., IEEE 802.3 Ethernet standards). As noted above, the communication component 1412 may include multiple communication components. For instance, a first communication component 1412 may be dedicated to shorter-range wireless communications such as Wi-Fi or Bluetooth, and a second communication component 1412 may be dedicated to longer-range wireless communications such as global positioning system (GPS), EDGE, GPRS, CDMA, WiMAX, LTE, EV-DO, or others. In some embodiments, a first communication component 1412 may be dedicated to wireless communications, and a second communication component 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any embedded or wired or wirelessly connected external device that generates an audible indicator, such speakers, headsets, or earbuds.

The electrical device 1400 may include an audio input device 1424 (or corresponding interface circuitry, as discussed above). The audio input device 1424 may include any embedded or wired or wirelessly connected device that generates a signal representative of a sound, such as microphones, microphone arrays, or digital instruments (e.g., instruments having a musical instrument digital interface (MIDI) output). The electrical device 1400 may include a Global Navigation Satellite System (GNSS) device 1418 (or corresponding interface circuitry, as discussed above), such as a Global Positioning System (GPS) device. The GNSS device 1418 may be in communication with a satellite-based system and may determine a geolocation of the electrical device 1400 based on information received from one or more GNSS satellites, as known in the art.

The electrical device 1400 may include other output device(s) 1410 (or corresponding interface circuitry, as discussed above). Examples of the other output device(s) 1410 may include an audio codec, a video codec, a printer, a wired or wireless transmitter for providing information to other devices, or an additional storage device.

The electrical device 1400 may include other input device(s) 1420 (or corresponding interface circuitry, as discussed above). Examples of the other input device(s) 1420 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1400 may be any other electronic device that processes data. In some embodiments, the electrical device 1400 may comprise multiple discrete physical components. Given the range of devices that the electrical device 1400 can be manifested as in various embodiments, in some embodiments, the electrical device 1400 can be referred to as a computing device or a computing system.

EXAMPLE EMBODIMENTS

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 includes a semiconductor die, comprising: a plurality of overlay marks, including: a first overlay mark at a first position on the semiconductor die, wherein the first overlay mark includes a first set of patterns having a first orientation; and a second overlay mark at a second position on the semiconductor die, wherein the second overlay mark includes a second set of patterns having a second orientation, wherein the second orientation is substantially orthogonal to the first orientation, and wherein the second position is non-overlapping with the first position.

Example 2 includes the semiconductor die of Example 1, further comprising a plurality of layers, wherein individual patterns of the first set of patterns and the second set of patterns are on one of the plurality of layers.

Example 3 includes the semiconductor die of Example 2, wherein: the plurality of layers includes a first layer and a second layer; the first set of patterns includes: a first pattern on the first layer; and a second pattern on the second layer; and the second set of patterns includes: a third pattern on the first layer; and a fourth pattern on the second layer.

Example 4 includes the semiconductor die of Example 3, wherein: the first pattern, the second pattern, the third pattern, and the fourth pattern are grating patterns; the first pattern and the second pattern are non-overlapping; and the third pattern and the fourth pattern are non-overlapping.

Example 5 includes the semiconductor die of Example 3, wherein: the first pattern, the second pattern, the third pattern, and the fourth pattern are grating patterns; the second pattern is superimposed above the first pattern; and the third pattern is superimposed above the fourth pattern.

Example 6 includes the semiconductor die of Example 2, wherein: the plurality of layers includes a first layer and a second layer; the first set of patterns includes a first pattern, a second pattern, a third pattern, and a fourth pattern, wherein: the first pattern and the second pattern are on the first layer; and the third pattern and the fourth pattern are on the second layer; and the second set of patterns includes a fifth pattern, a sixth pattern, a seventh pattern, and an eighth pattern, wherein: the fifth pattern and the sixth pattern are on the first layer; and the seventh pattern and the eighth pattern are on the second layer.

Example 7 includes the semiconductor die of Example 6, wherein: the first set of patterns is a first set of grating patterns, wherein: the first pattern has a different design than the second pattern; and the third pattern has a different design than the fourth pattern; and the second set of patterns is a second set of grating patterns, wherein: the fifth pattern has a different design than the sixth pattern; and the seventh pattern has a different design than the eighth pattern.

Example 8 includes the semiconductor die of any of Examples 1-7, wherein individual patterns of the first set of patterns and the second set of patterns have 180° symmetry.

Example 9 includes the semiconductor die of any of Examples 1-8, wherein: the first overlay mark and the second overlay mark are one-dimensional overlay marks; the first overlay mark is for measuring overlay on a first axis corresponding to a first dimension; and the second overlay mark is for measuring overlay on a second axis corresponding to a second dimension, wherein the second axis is substantially orthogonal to the first axis.

Example 10 includes the semiconductor die of any of Examples 1-9, wherein the semiconductor die is electrically coupled to a package substrate; and the package substrate is electrically coupled to a board.

Example 11 includes a method of measuring overlay, comprising: printing a first feature and a second feature on a first layer over a substrate, wherein: the first feature has a first orientation and is printed in a first location over the substrate; and the second feature has a second orientation and is printed in a second location over the substrate, wherein the second orientation is substantially orthogonal to the first orientation, and wherein the second location is non-overlapping with the first location; printing a third feature and a fourth feature on a second layer over the substrate, wherein: the third feature has the first orientation and is printed in the first location over the substrate; and the fourth feature has the second orientation and is printed in the second location over the substrate; measuring a first overlay error between the first layer and the second layer along a first axis, wherein the first overlay error is measured based on the first feature and the third feature; and measuring a second overlay error between the first layer and the second layer along a second axis, wherein the second overlay error is measured based on the second feature and the fourth feature, wherein the second axis is substantially orthogonal to the first axis.

Example 12 includes the method of Example 11, wherein: the first feature includes a first set of patterns on the first layer, wherein the first set of patterns have the first orientation; the second feature includes a second set of patterns on the first layer, wherein the second set of patterns have the second orientation; the third feature includes a third set of patterns on the second layer, wherein the third set of patterns have the first orientation; and the fourth feature includes a fourth set of patterns on the second layer, wherein the fourth set of patterns have the second orientation.

Example 13 includes the method of Example 12, wherein: measuring the first overlay error between the first layer and the second layer along the first axis comprises: selecting a first pattern from the first set of patterns; selecting a second pattern from the third set of patterns; and computing the first overlay error based on the first pattern and the second pattern; and measuring the second overlay error between the first layer and the second layer along the second axis comprises: selecting a third pattern from the second set of patterns; selecting a fourth pattern from the fourth set of patterns; and computing the second overlay error based on the third pattern and the fourth pattern.

Example 14 includes the method of Example 13, wherein the first pattern, the second pattern, the third pattern, and the fourth pattern each have 180° symmetry.

Example 15 includes the method of Example 14, wherein: computing the first overlay error based on the first pattern and the second pattern comprises: computing a first center of symmetry for the first pattern; computing a second center of symmetry for the second pattern; and computing a difference between the first center of symmetry and the second center of symmetry; and computing the second overlay error based on the third pattern and the fourth pattern comprises: computing a third center of symmetry for the third pattern; computing a fourth center of symmetry for the fourth pattern; and computing a difference between the third center of symmetry and the fourth center of symmetry.

Example 16 includes the method of any of Examples 12-15, wherein: the first set of patterns is a first set of grating patterns having different layouts; the second set of patterns is a second set of grating patterns having different layouts;

the third set of patterns is a third set of grating patterns having different layouts; and the fourth set of patterns is a fourth set of grating patterns having different layouts.

Example 17 includes an electronic device, comprising: processing circuitry, memory circuitry, or communication circuitry on an integrated circuit die, wherein the integrated circuit die comprises: a plurality of overlay marks, including: a first overlay mark at a first position on the integrated circuit die, wherein the first overlay mark includes a first set of patterns having a first orientation; and a second overlay mark at a second position on the integrated circuit die, wherein the second overlay mark includes a second set of patterns having a second orientation, wherein the second orientation is substantially orthogonal to the first orientation, and wherein the second position is non-overlapping with the first position.

Example 18 includes the electronic device of Example 17, wherein the integrated circuit die further comprises a plurality of layers, wherein individual patterns of the first set of patterns and the second set of patterns are on one of the plurality of layers.

Example 19 includes the electronic device of Example 18, wherein: the plurality of layers includes a first layer and a second layer; the first set of patterns includes a first pattern, a second pattern, a third pattern, and a fourth pattern, wherein: the first pattern and the second pattern are on the first layer; and the third pattern and the fourth pattern are on the second layer; and the second set of patterns includes a fifth pattern, a sixth pattern, a seventh pattern, and an eighth pattern, wherein: the fifth pattern and the sixth pattern are on the first layer; and the seventh pattern and the eighth pattern are on the second layer.

Example 20 includes the electronic device of Example 19, wherein: the first set of patterns is a first set of grating patterns, wherein: the first pattern has a different pitch than the second pattern; and the third pattern has a different pitch than the fourth pattern; and the second set of patterns is a second set of grating patterns, wherein: the fifth pattern has a different pitch than the sixth pattern; and the seventh pattern has a different pitch than the eighth pattern.

While the concepts of the present disclosure are susceptible to various modifications and alternative forms, specific embodiments thereof have been shown by way of example in the drawings and are described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features. Further, it should be understood that the various embodiments shown in the figures are illustrative representations and are not necessarily drawn to scale.

Moreover, the illustrations and/or descriptions of various embodiments may be simplified or approximated for ease of understanding, and as a result, they may not necessarily reflect the level of precision nor variation that may be present in actual embodiments. For example, while some figures generally indicate straight lines, right angles, and smooth surfaces, actual implementations of the disclosed embodiments may have less than perfect straight lines and right angles, and some features may have surface topography or otherwise be non-smooth, given real-world limitations of fabrication processes. Similarly, illustrations and/or descriptions of how components are arranged may be simplified or approximated for ease of understanding and may vary by some margin of error in actual embodiments (e.g., due to fabrication processes, etc.).

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "layer" may refer to one or more structures formed using the same reticle and/or during the same processing step of a semiconductor fabrication process.

The term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

The term "coreless" generally refers to a substrate of an integrated circuit package having no core. The lack of a core allows for higher-density package architectures, as the through-vias have relatively large dimensions and pitch compared to high-density interconnects.

The term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

The term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term “bond pad” generally refers to metallization structures that terminate integrated traces and vias in integrated circuit packages and dies. The term “solder pad” may be occasionally substituted for “bond pad” and carries the same meaning.

The term “solder bump” generally refers to a solder layer formed on a bond pad. The solder layer typically has a round shape, hence the term “solder bump”.

The term “substrate” generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the “die side”, comprises solder bumps for chip or die bonding. The opposite side of the substrate, generally referred to as the “land side”, comprises solder bumps for bonding the package to a printed circuit board.

The term “assembly” generally refers to a grouping of parts into a single functional unit. The parts may be separate and are mechanically assembled into a functional unit, where the parts may be removable. In another instance, the parts may be permanently bonded together. In some instances, the parts are integrated together.

The terms “coupled” or “connected” means a direct or indirect connection, such as a direct electrical, mechanical, magnetic or fluidic connection between the things that are connected or an indirect connection, through one or more passive or active intermediary devices.

The term “circuit” or “module” may refer to one or more passive and/or active components that are arranged to cooperate with one another to provide a desired function. The term “signal” may refer to at least one current signal, voltage signal, magnetic signal, or data/clock signal. The meaning of “a,” “an,” and “the” include plural references. The meaning of “in” includes “in” and “on.”

The vertical orientation is in the z-direction and it is understood that recitations of “top”, “bottom”, “above” and “below” refer to relative positions in the z-dimension with the usual meaning. However, it is understood that embodiments are not necessarily limited to the orientations or configurations illustrated in the figure.

The terms “substantially,” “close,” “approximately,” “near,” and “about,” generally refer to being within +/−10% of a target value (unless specifically specified). Unless otherwise specified the use of the ordinal adjectives “first,” “second,” and “third,” etc., to describe a common object, merely indicate that different instances of like objects to which are being referred and are not intended to imply that the objects so described must be in a given sequence, either temporally, spatially, in ranking or in any other manner.

For the purposes of the present disclosure, phrases “A and/or B” and “A or B” mean (A), (B), or (A and B). For the purposes of the present disclosure, the phrase “A, B, and/or C” means (A), (B), (C), (A and B), (A and C), (B and C), or (A, B and C).

Views labeled “cross-sectional”, “profile” and “plan” correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

The invention claimed is:

1. A semiconductor die, comprising:

a plurality of overlay marks, including:

a first overlay mark at a first position on the semiconductor die, wherein the first overlay mark includes a first set of patterns having a first orientation, wherein the first overlay mark does not include patterns having a second orientation substantially orthogonal to the first orientation; and a second overlay mark at a second position on the semiconductor die, wherein the second overlay mark includes a second set of patterns having the second orientation, wherein the second overlay mark does not include patterns having the first orientation, and wherein the second position is non-overlapping with the first position.

2. The semiconductor die of claim 1, further comprising a plurality of layers, wherein individual patterns of the first set of patterns and the second set of patterns are on one of the plurality of layers.

3. The semiconductor die of claim 2, wherein:

the plurality of layers includes a first layer and a second layer;

the first set of patterns includes:

a first pattern on the first layer; and a second pattern on the second layer; and the second set of patterns includes:

a third pattern on the first layer; and a fourth pattern on the second layer.

4. The semiconductor die of claim 3, wherein:

the first pattern, the second pattern, the third pattern, and the fourth pattern are grating patterns;

the first pattern and the second pattern are non-overlapping; and the third pattern and the fourth pattern are non-overlapping.

5. The semiconductor die of claim 3, wherein:

the first pattern, the second pattern, the third pattern, and the fourth pattern are grating patterns;

the second pattern is superimposed above the first pattern; and the third pattern is superimposed above the fourth pattern.

6. The semiconductor die of claim 2, wherein:

the plurality of layers includes a first layer and a second layer;

the first set of patterns includes a first pattern, a second pattern, a third pattern, and a fourth pattern, wherein:

the first pattern and the second pattern are on the first layer; and the third pattern and the fourth pattern are on the second layer; and the second set of patterns includes a fifth pattern, a sixth pattern, a seventh pattern, and an eighth pattern, wherein:

the fifth pattern and the sixth pattern are on the first layer; and the seventh pattern and the eighth pattern are on the second layer.

7. The semiconductor die of claim 6, wherein:

the first set of patterns is a first set of grating patterns, wherein:

the first pattern has a different design than the second pattern; and the third pattern has a different design than the fourth pattern; and the second set of patterns is a second set of grating patterns, wherein:

the fifth pattern has a different design than the sixth pattern; and the seventh pattern has a different design than the eighth pattern.

8. The semiconductor die of claim 1, wherein individual patterns of the first set of patterns and the second set of patterns have 180° symmetry.

9. The semiconductor die of claim 1, wherein:

the first overlay mark and the second overlay mark are one-dimensional overlay marks;

the first overlay mark is for measuring overlay on a first axis corresponding to a first dimension; and the second overlay mark is for measuring overlay on a second axis corresponding to a second dimension, wherein the second axis is substantially orthogonal to the first axis.

10. The semiconductor die of claim 1, wherein:

the semiconductor die is electrically coupled to a package substrate; and the package substrate is electrically coupled to a board.

11. An electronic device, comprising:

processing circuitry, memory circuitry, or communication circuitry on an integrated circuit die, wherein the integrated circuit die comprises:

a plurality of overlay marks, including:

a first overlay mark at a first position on the integrated circuit die, wherein the first overlay mark includes a first set of patterns having a first orientation, wherein the first overlay mark does not include patterns having a second orientation substantially orthogonal to the first orientation; and a second overlay mark at a second position on the integrated circuit die, wherein the second overlay mark includes a second set of patterns having the second orientation, wherein the second overlay mark does not include patterns having the first orientation, and wherein the second position is non-overlapping with the first position.

12. The electronic device of claim 11, wherein the integrated circuit die further comprises a plurality of layers, wherein individual patterns of the first set of patterns and the second set of patterns are on one of the plurality of layers.

13. The electronic device of claim 12, wherein:

the plurality of layers includes a first layer and a second layer;

the first set of patterns includes a first pattern, a second pattern, a third pattern, and a fourth pattern, wherein:

the first pattern and the second pattern are on the first layer; and the third pattern and the fourth pattern are on the second layer; and the second set of patterns includes a fifth pattern, a sixth pattern, a seventh pattern, and an eighth pattern, wherein:

the fifth pattern and the sixth pattern are on the first layer; and the seventh pattern and the eighth pattern are on the second layer.

14. The electronic device of claim 13, wherein:

the first set of patterns is a first set of grating patterns, wherein:

the first pattern has a different pitch than the second pattern; and the third pattern has a different pitch than the fourth pattern; and the second set of patterns is a second set of grating patterns, wherein:

the fifth pattern has a different pitch than the sixth pattern; and the seventh pattern has a different pitch than the eighth pattern.

15. The semiconductor die of claim 1, wherein:

the first set of patterns includes at least two patterns on a common layer, wherein the at least two patterns have different characteristics from one another; and the second set of patterns includes at least two patterns on a common layer, wherein the at least two patterns have different characteristics from one another.

16. The semiconductor die of claim 1, wherein individual patterns of the first set of patterns on a first layer and individual patterns of the second set of patterns on the first layer are formed by a same reticle.

17. The semiconductor die of claim 1, wherein:

the first set of patterns enables overlay to be measured along a first axis independently of other patterns; and the second set of patterns enables overlay to be measured along a second axis independently of other patterns, wherein the second axis is substantially orthogonal to the first axis.

18. The semiconductor die of claim 1, wherein the first and second overlay marks are one-dimensional overlay marks.

19. An integrated circuit, comprising:

a first overlay mark comprising a plurality of first patterns to measure overlay along a first axis, wherein the first overlay mark does not comprise patterns to measure overlay along a second axis substantially orthogonal to the first axis; and a second overlay mark comprising a plurality of second patterns to measure overlay along the second axis, wherein the second overlay mark does not comprise patterns to measure overlay along the first axis.

20. The integrated circuit of claim 19, wherein the first and second overlay marks are physically separate overlay marks in different positions on the integrated circuit.

21. The integrated circuit of claim 19, wherein:

the first patterns enable overlay to be measured along the first axis independently of other patterns; and the second patterns enable overlay to be measured along the second axis independently of other patterns.

22. The integrated circuit of claim 19, wherein:

the first patterns have a first orientation and the second patterns have a second orientation, wherein the first and second orientations are substantially orthogonal; and the first overlay mark does not comprise patterns having the second orientation and the second overlay mark does not comprise patterns having the first orientation.

23. The integrated circuit of claim 19, wherein:

the plurality of first patterns include at least two patterns on a common layer, wherein the at least two patterns have different styles of measurement features; and the plurality of second patterns include at least two patterns on a common layer, wherein the at least two patterns have different styles of measurement features.

* * * * *